United States Patent
Futatsuyama et al.

(10) Patent No.: US 8,711,634 B2
(45) Date of Patent: Apr. 29, 2014

(54) NONVOLATILE SEMICONDUCTOR MEMORY DEVICE AND METHOD FOR CONTROLLING THE SAME

(75) Inventors: Takuya Futatsuyama, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 13/335,095

(22) Filed: Dec. 22, 2011

(65) Prior Publication Data
US 2012/0163096 A1    Jun. 28, 2012

(30) Foreign Application Priority Data
Dec. 28, 2010 (JP) ................ P2010-291948

(51) Int. Cl.
*G11C 16/04* (2006.01)
(52) U.S. Cl.
USPC ............................................... 365/185.22
(58) Field of Classification Search
USPC .............. 365/185.02, 189.05, 185.17, 185.18
See application file for complete search history.

(56) References Cited

U.S. PATENT DOCUMENTS

| | | | |
|---|---|---|---|
| 7,440,331 B2 | 10/2008 | Hemink | |
| 7,916,547 B2 | 3/2011 | Hosono | |
| 7,965,555 B2 | 6/2011 | Namiki et al. | |
| 8,023,327 B2 | 9/2011 | Futatsuyama | |
| 8,472,266 B2 * | 6/2013 | Khandelwal et al. | .... 365/189.15 |
| 2011/0069557 A1 | 3/2011 | Namiki et al. | |
| 2011/0157997 A1 | 6/2011 | Kamigaichi et al. | |
| 2011/0242892 A1 | 10/2011 | Namiki et al. | |

FOREIGN PATENT DOCUMENTS

| | | |
|---|---|---|
| JP | 2009-193631 A | 8/2009 |
| JP | 2009-539203 A | 11/2009 |
| JP | 2010-086628 A | 4/2010 |
| JP | 2011-141939 | 7/2011 |

OTHER PUBLICATIONS

Office Action issued Jul. 9, 2013 in Japanese Patent Application No. 2010-291948 (with English language translation).

* cited by examiner

*Primary Examiner* — Matthew W Such
*Assistant Examiner* — Ajay Ojha
(74) *Attorney, Agent, or Firm* — Oblon, Spivak, McClelland, Maier & Neustadt, L.L.P.

(57) ABSTRACT

During data read process, a control circuit gives a read voltage to a selected word line connected to a selected memory cell, and gives read pass voltages, for turning on memory cells, to unselected word lines connected to unselected memory cells. The control circuit respectively gives a first read pass voltage, a second read pass voltage, and a third read pass voltage to a first unselected word line adjacent to the selected word line at a side of at least one of a bit line and a source line, a second unselected word line adjacent to the first unselected word line at a side opposite to the selected word line, and a third unselected word line adjacent to the second unselected word line at a side opposite to the selected word line. The second read pass voltage is higher than the third read pass voltage.

20 Claims, 28 Drawing Sheets

FIG. 24

|  | 1st bit (Lower page) | 2nd bit (Upper page) |
|---|---|---|
| WL_M-1 | 2M-2 | 2M |
| WL_M-2 | 2M-4 | 2M-1 |
| WL_M-3 | 2M-6 | 2M-3 |
| ⋮ | ⋮ | ⋮ |
| WL_6 | 12 | 15 |
| WL_5 | 10 | 13 |
| WL_4 | 8 | 11 |
| WL_3 | 6 | 9 |
| WL_2 | 4 | 7 |
| WL_1 | 2 | 5 |
| WL_0 | 1 | 3 |

FIG. 26

|  | 1) (verify) | 3) (verify) | 1),2),3),4) (read) |
|---|---|---|---|
| WL_N+5 | Vpvd | Vpvd | Vread |
| WL_N+3 | Vpvd | Vpvd | Vread |
| WL_N+4 | Vpvd | Vpvd | Vread |
| WL_N+2 | Vread122 | Vread142 | Vread22 |
| WL_N+1 | Vread121 | Vread141 | Vread21 |
| WL_N | Vcg(verify_1) | Vcg(verify_2) | Vcg |
| WL_N-1 | Vread131 | Vread151 | Vread31 |
| WL_N-2 | Vread132 | Vread152 | Vread32 |
| WL_N-3 | Vread | Vread | Vread |
| WL_N-4 | Vread | Vread | Vread |
| WL_N-5 | Vread | Vread | Vread |

FIG. 25

|  | 1) | 2) | | 3) | 4) | | |
|---|---|---|---|---|---|---|---|
|  |  | 2)-1 | 2)-2 |  | 4)-1 |  | 4)' |
| WL_N+5 | ERASE STATE | ERASE STATE | ERASE STATE | ERASE STATE | ERASE STATE |  | L/Ⓤ |
| WL_N+4 | ERASE STATE | ERASE STATE | ERASE STATE | ERASE STATE | ERASE STATE |  | L/U |
| WL_N+3 | ERASE STATE | ERASE STATE | ERASE STATE | ERASE STATE | ERASE STATE |  | L/U |
| WL_N+2 | ERASE STATE | ERASE STATE | ERASE STATE | ERASE STATE | Ⓛ |  | L/U |
| WL_N+1 | ERASE STATE | ERASE STATE | Ⓛ | L | L |  | L/U |
| WL_N | Ⓛ | L | L | L/Ⓤ | L/U | .... | L/U | ← SELECTED WL
| WL_N-1 | L | L/Ⓤ | L/U | L/U | L/U |  | L/U |
| WL_N-2 | L/U | L/U | L/U | L/U | L/U |  | L/U |
| WL_N-3 | L/U | L/U | L/U | L/U | L/U |  | L/U |
| WL_N-4 | L/U | L/U | L/U | L/U | L/U |  | L/U |
| WL_N-5 | L/U | L/U | L/U | L/U | L/U |  | L/U |

NONVOLATILE SEMICONDUCTOR MEMORY DEVICE AND METHOD FOR CONTROLLING THE SAME

CROSS-REFERENCE TO RELATED APPLICATIONS

This application is based upon and claims the benefit of priority from the prior Japanese Patent Application No. 2010-291948, filed on Dec. 28, 2010, the entire contents of which are incorporated herein by reference.

FIELD

Embodiments described herein relate to a nonvolatile semiconductor memory device and a method for controlling the same.

BACKGROUND

Description of the Related Art

The sizes of nonvolatile semiconductor memory devices such as NAND flash memories are decreasing. Among them, progress is made in planar scaling in a word line pitch, a bit line pitch, cell interval, and the like. On the other hand, scaling in the height direction is difficult in order to ensure the reliability of cell characteristics. As a result, various cell-to-cell interferences are becoming prominent. For example, a case where a charge storage layer is a floating gate will be explained. In this case, as described above, the scaling in the height direction is difficult. Therefore, the ratio of a channel capacitance occupied with respect to the total capacitance of the floating gate decreases, and an object cell is more greatly affected by the control gate (WL) voltage of an adjacent cell and the potential of the floating gate of the adjacent cell.

For example, more specifically, cell-to-cell interferences include the following two issues.

The first issue is cell-to-cell interference in which the potential of the floating gate of the adjacent cell affects the floating gate potential of the object cell. In this phenomenon, when the adjacent cell is written, a threshold voltage (Vth) of the adjacent cell increases, and as a result, the threshold voltage of the object cell also increases.

The second issue is cell-to-cell interference in which the word line voltage of the adjacent cell affects the floating gate potential of the object cell. In this phenomenon, when the adjacent cell is read, and in particular, when data at a lower threshold value level are read, the control gate voltage of the adjacent cell is lower. Therefore, it is difficult for the potential of the floating gate of the object cell to increase, and when the threshold value of the object cell is written at a high level, it is difficult for the object cell to attain ON state.

Although progress is made in scaling of the word line pitch, the scaling in the height direction is difficult. Therefore, in the case of the NAND flash memory, a write voltage (Vpgm) during programming and a read pass voltage (Vread) during read process do not decrease greatly along with downsizing. On the other hand, space between word lines becomes narrower, and electric field strength between word lines and electric field strength between the floating gate of an adjacent cell and a word line become higher.

Therefore, along with the downsizing, it is becoming essential to avoid increase in the word line potential difference between adjacent cells.

BRIEF DESCRIPTION OF THE DRAWINGS

FIG. 24 is a figure illustrating writing order of data of two bits/cell of the memory cell array according to a twentieth embodiment;

FIG. 25 is a figure illustrating writing state of the object cell according to the embodiment at each time point;

FIG. 26 is a figure illustrating an applied voltage during read process of the memory cell array according to the embodiment;

DETAILED DESCRIPTION

A nonvolatile semiconductor memory device according to an embodiment includes a memory cell array having a NAND cell unit including a plurality of memory cells connected in series each having a control gate and a charge storage layer, one end of the NAND cell unit being connected to a bit line via a first selection gate transistor, the other end of the NAND cell unit being connected to a source line via a second selection gate transistor, control gates of the plurality of memory cells being respectively connected to word lines, gates of the first and second selection gate transistors being respectively connected to the first and second selection gate lines, and a control circuit, wherein during data read process, the control circuit gives a read voltage to a selected word line connected to a selected memory cell of the plurality of memory cells from which data is read, and gives read pass voltages for turning on the memory cells regardless of cell data to unselected word lines connected to unselected memory cells of the plurality of memory cells, wherein the control circuit respectively gives a first read pass voltage, a second read pass voltage, and a third read pass voltage to a first unselected word line adjacent to the selected word line at a side of at least one of a bit line and a source line, a second unselected word line adjacent to the first unselected word line at a side opposite to the selected word line, and a third unselected word line adjacent to the second unselected word line at a side opposite to the selected word line, and wherein the second read pass voltage is higher than the third read pass voltage.

Hereinafter, embodiments will be explained with reference to the attached drawings.

[Entire Configuration of Nonvolatile Semiconductor Memory Device]

Figure 1:
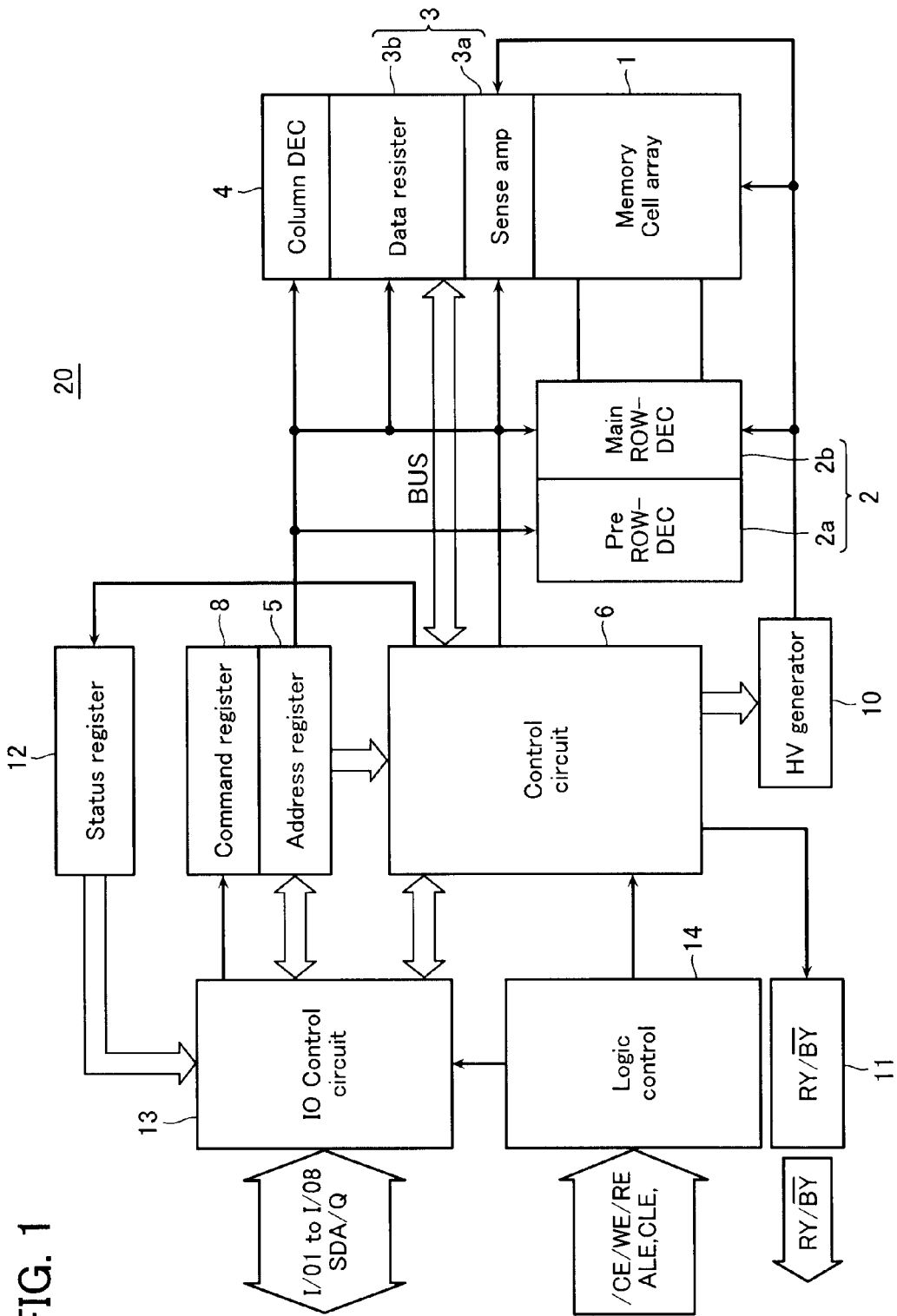
FIG. 1 is a block diagram illustrating a NAND-type nonvolatile semiconductor memory device.

First, the entire configuration of the nonvolatile semiconductor memory device will be explained with reference to FIGS. 1 to 5. FIG. 1 is a block diagram illustrating a configuration of a NAND-type flash memory, i.e., an example of the nonvolatile semiconductor memory device. As shown in FIG. 1, the NAND-type flash memory 20 includes a memory cell array 1 including a plurality of memory cells arranged in a matrix form having floating gates as charge storage layers. A row decoder circuit 2 is provided at a side portion in a word line direction of the memory cell array 1 so as to selectively drive word lines and selection gate lines. A sense amplifier circuit 3 is provided at a side portion in a bit line direction thereof to be used for reading and writing of cell data via bit lines. The row decoder circuit 2 includes a pre-row decoder 2a and a main row decoder 2b. The sense amplifier circuit 3 includes a sense amplifier 3a and a data register 3b.

Commands, addresses, and data are input via an input/output control circuit 13. A chip enable signal /CE, a write enable signal /WE, a read enable signal /RE, and other external control signals are input to a logic circuit 14 and used for timing-control. The commands are decoded by a command register 8.

A control circuit 6 performs data transfer control and sequence control of writing/erasing/read processes. The control circuit 6 outputs the Ready/Busy state of the NAND-type flash memory 20 to the Ready/Busy terminal 11. Further, a status register 12 is prepared to transmit the state (such as Pass/Fail, Ready/Busy) of the NAND-type flash memory 20 to a host via the input/output control circuit 13.

The addresses are transferred to the row decoder circuit 2 and the column decoder 4 via an address register 5. The row decoder circuit 2 selects a word line based on a row address. The column decoder 4 selects a bit line based on a column address. Write data are loaded to the sense amplifier circuit 3 via the input/output control circuit 13, the control circuit 6, and a data bus BUS. Read data are output to the outside via the control circuit 6.

A high voltage generation circuit 10 is provided to generate a high voltage needed according to each operation mode. The high voltage generation circuit 10 generates a predetermined high voltage such as a write pulse voltage based on a control signal given by the control circuit 6.

[Configuration of Memory Cell Array 1]

Figure 2:
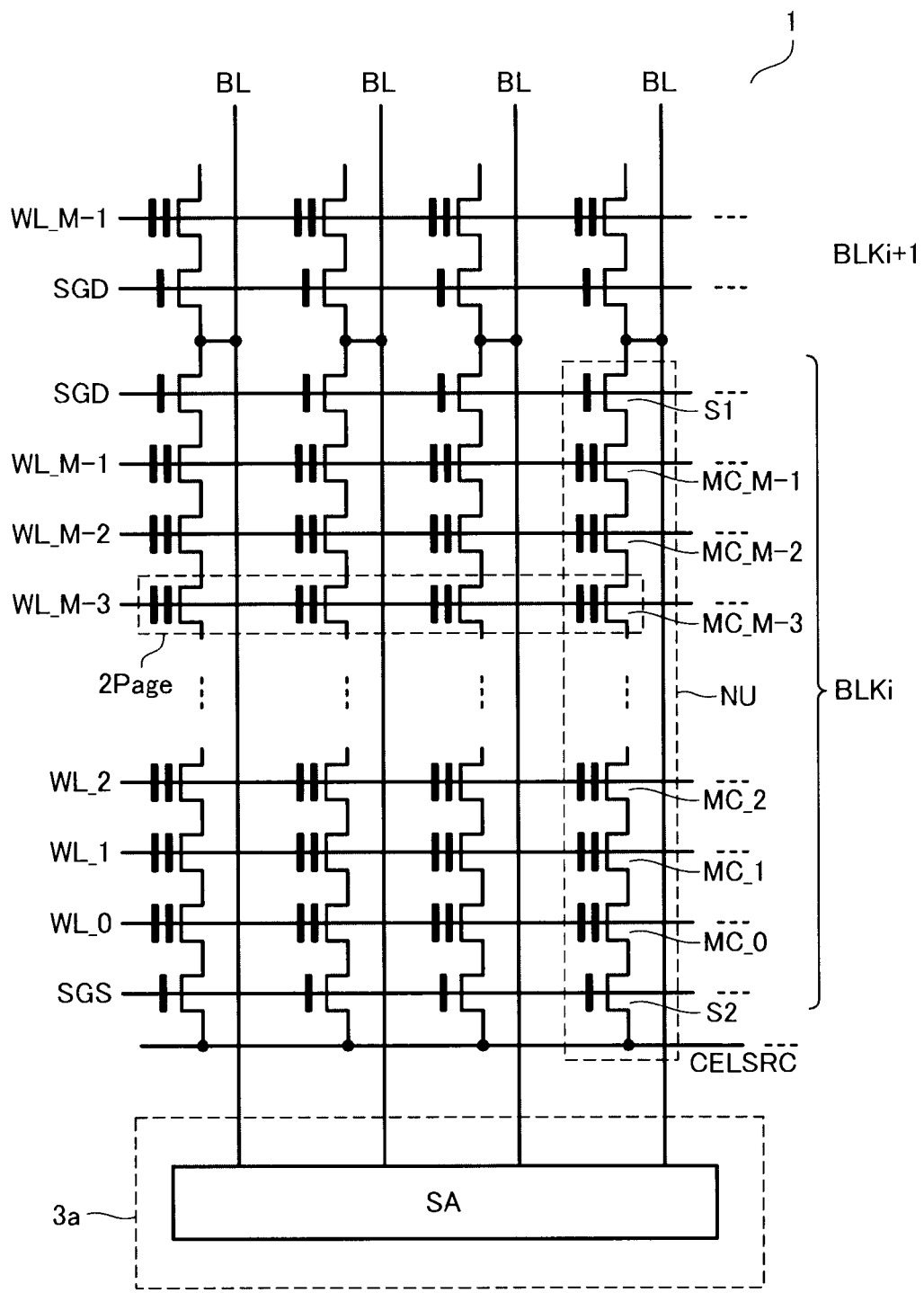
FIG. 2 is an equivalent circuit diagram illustrating a structure of a memory cell array of the nonvolatile semiconductor memory device.

FIG. 2 is a circuit diagram illustrating a configuration of the memory cell array 1. As shown in FIG. 2, the memory cell array 1 is constituted by NAND cell units NU each including selection gate transistors S1, S2 respectively connected to both ends of a NAND string having electrically rewritable M nonvolatile memory cells MC_0 to MC_M−1 connected in series. In this case, M is, for example, 8, 16, 32, 33, 34, 64, 66, 68 or 88.

One end of the NAND cell unit NU (at the side of the selection gate transistor S1) is connected to a bit line BL. The other end thereof (at the side of the selection gate transistor S2) is connected to a common source line CELSRC. The gate electrodes of the selection gate transistors S1, S2 are connected to selection gate lines SGD, SGS. The control gate electrodes of the memory cells MC_0 to MC_M−1 are respectively connected to word lines WL_0 to WL_M−1. The bit line BL is connected to the sense amplifier 3a, and the word lines WL_0 to WL_M−1 and the selection gate lines SGD, SGS are connected to the row decoder circuit 2.

When a memory cell MC is one bit/cell in which one bit of data is stored, the memory cells MC formed along one word line WL crossing the NAND cell unit NU store one page of data. When a memory cell MC is two bits/cell in which two bits of data are stored, the memory cells MC formed along one word line WL store two pages of data (upper page UPPER, lower page LOWER).

One block BLK is formed with a plurality of NAND cell unit NU each sharing a word line WL. One block BLK forms one unit for data erase operation. In one memory cell array 1, the number of word lines WL in one block BLK is M, and the number of pages in one block is M×2=128 pages when the memory cell MC is two bits/cell.

[Configurations of Memory Cell MC and Selection Gate Transistors S1, S2]

Figure 3:
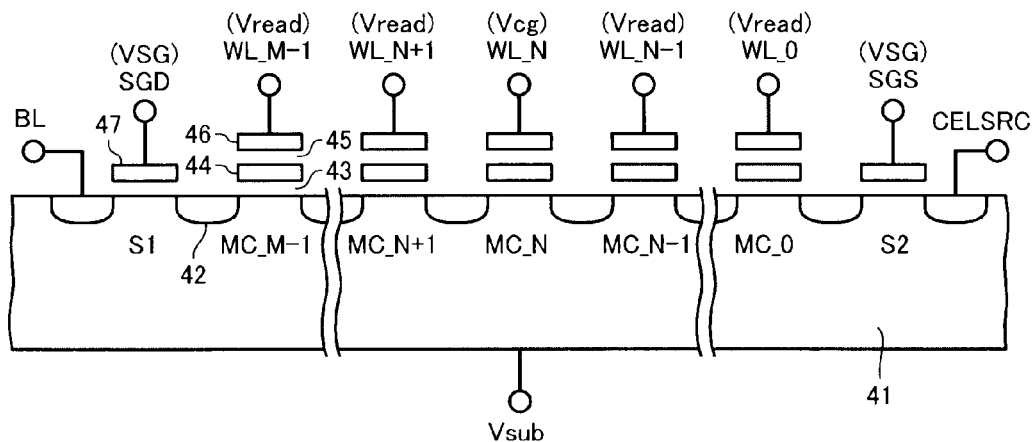
FIG. 3 is a schematic cross sectional view illustrating a NAND cell unit of the nonvolatile semiconductor memory device.

FIG. 3 illustrates a cross sectional structure of the memory cells MC_0 to MC_M−1 and the selection gate transistors S1, S2. As shown in FIG. 3, a p-type well 41 formed in a substrate is formed with n-type diffusion layers 42 that function as sources and drains of MOSFETs constituting the memory cells MC. A floating gate (FG) 44 is formed on the well 41 with a tunnel insulating film 43 interposed therebetween. A control gate (CG) 46 is formed on the floating gate 44 with an inter-gate insulating film 45 interposed therebetween. The control gate 46 constitutes a word line WL. In each of the selection gate transistors S1, S2, a selection gate 47 is provided on the well 41 with the gate insulating film 43 interposed therebetween. The gates 47 constitute the selection gate lines SGS, SGD. The memory cell MC and the selection gate transistors S1, S2 are NAND-connected in such a manner that the drain and the source are shared by those adjacent to each other.

[Data Storage State]

Figure 4:
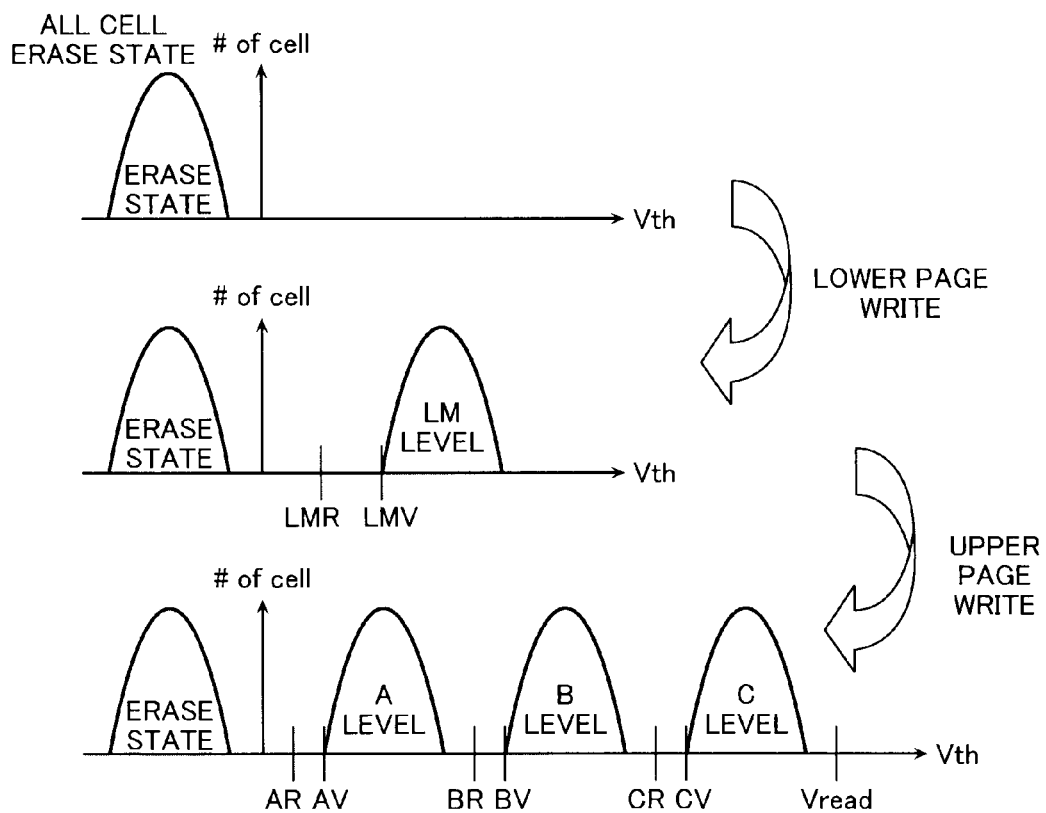
FIG. 4 is a figure illustrating a threshold value distribution of a memory cell in the nonvolatile semiconductor memory device.

Subsequently, a threshold value distribution, i.e., data storage state in a memory cell, will be explained with reference to FIG. 4. FIG. 4 is a figure illustrating a threshold voltage distribution in a case of two bits/cell. In this case, two bits/cell is used as an example. However, each embodiment described below is not limited thereto.

Four kinds of threshold voltage distributions (erase state, A level, B level, C level, which are ascending order of the threshold voltage) are provided as data threshold voltage distributions. For example, four types of data "11", "01", "00", "10" listed below are allocated to these threshold voltage distributions. In this case, the data are represented by upper page data and lower page data, and data write process is performed in the following order: writing of the lower page data and then writing of the upper data. The threshold voltage distribution of the erase state is a negative threshold voltage state obtained by a collective block erase process.

The data erase operation in the NAND-type flash memory is executed in units of blocks BLK. The data erase operation is executed by causing all the word lines WL of the selected block BLK to attain 0 V and applying a positive boosted erase voltage (for example, 18 V to 20 V) to the P-type well 41 in which the memory cell array 1 is formed. As a result, negative threshold voltage state (erase state) is obtained in which electrons of the floating gates 44 are discharged in all the memory cells MC of the selected block BLK.

[Write Operation]

In order to write data of two bits/cell, first, all the memory cells MC of the selected block BLK are set at the negative threshold voltage distribution as a result of the above erase operation. Subsequently, as shown in FIG. 4, lower page write operation is executed to write a portion of the memory cell MC in the threshold voltage distribution in the erase state to an intermediate level LM of threshold voltage distributions A, B.

Thereafter, as shown in FIG. 4, the threshold voltage of the memory cell MC to which data are written is increased to A level from the threshold voltage distribution in the erase state. Further, the threshold voltages of the memory cells MC to which other data are written are increased from the intermediate level LM to threshold voltage distributions B, C, respectively. As a result, upper page write process is done.

During the data write operation, a voltage VSS is applied to a bit line BL corresponding to the selected memory cell MC whose threshold voltage distribution is increased, and this is transferred to the channel of the selected memory cell MC via the drain-side selection gate transistor S1 in conductive state. A write pulse voltage Vpgm (for example, 15 V to 20 V) is applied to the selected word line WL connected to the selected memory cell MC. At this occasion, high electric field strength is applied between the floating gate 44 and the channel in the selected memory cell MC, and electrons are injected from the channel to the floating gate 44 by FN tunneling. As a result, the threshold voltage distribution of the selected memory cell MC increases.

A voltage VDD is applied to a bit line BL for the memory cells MC whose threshold voltage distributions are not increased, and this is transferred to the channel of the memory cells MC via the drain-side selection gate transistor S1 in conductive state. After the channel is charged to the voltage VDD, the drain-side selection gate transistor S1 is in non-conductive state. When the channel of the selected memory cell MC is brought into a floating state, and the program voltage Vpgm is applied to the selected word line WL, the potential of the channel increases with the capacity coupling with the selected word line WL, and hardly any electron is injected into the floating gate electrode.

[Write Verification Operation]

As shown in FIG. 4, during lower page write process (writing of intermediate level LM), writing state is confirmed with a verification voltage LMV corresponding to the lowermost value of the write threshold voltage. In other words, when the selected memory cell MC is conductive in the verification read operation in which the verification voltage LMV is applied to the selected word line WL, the writing state is determined to be "fail". When the selected memory cell MC is non-conductive, the writing state is determined to be "pass". Likewise, during upper page write process, writings of the threshold voltage distributions A, B, C are respectively confirmed with verification voltages AV, BV, CV.

[Read Operation]

Subsequently, conventional read operation will be explained before explaining read operation performed by the memory cell array 1 according to the embodiment.

Figure 31:
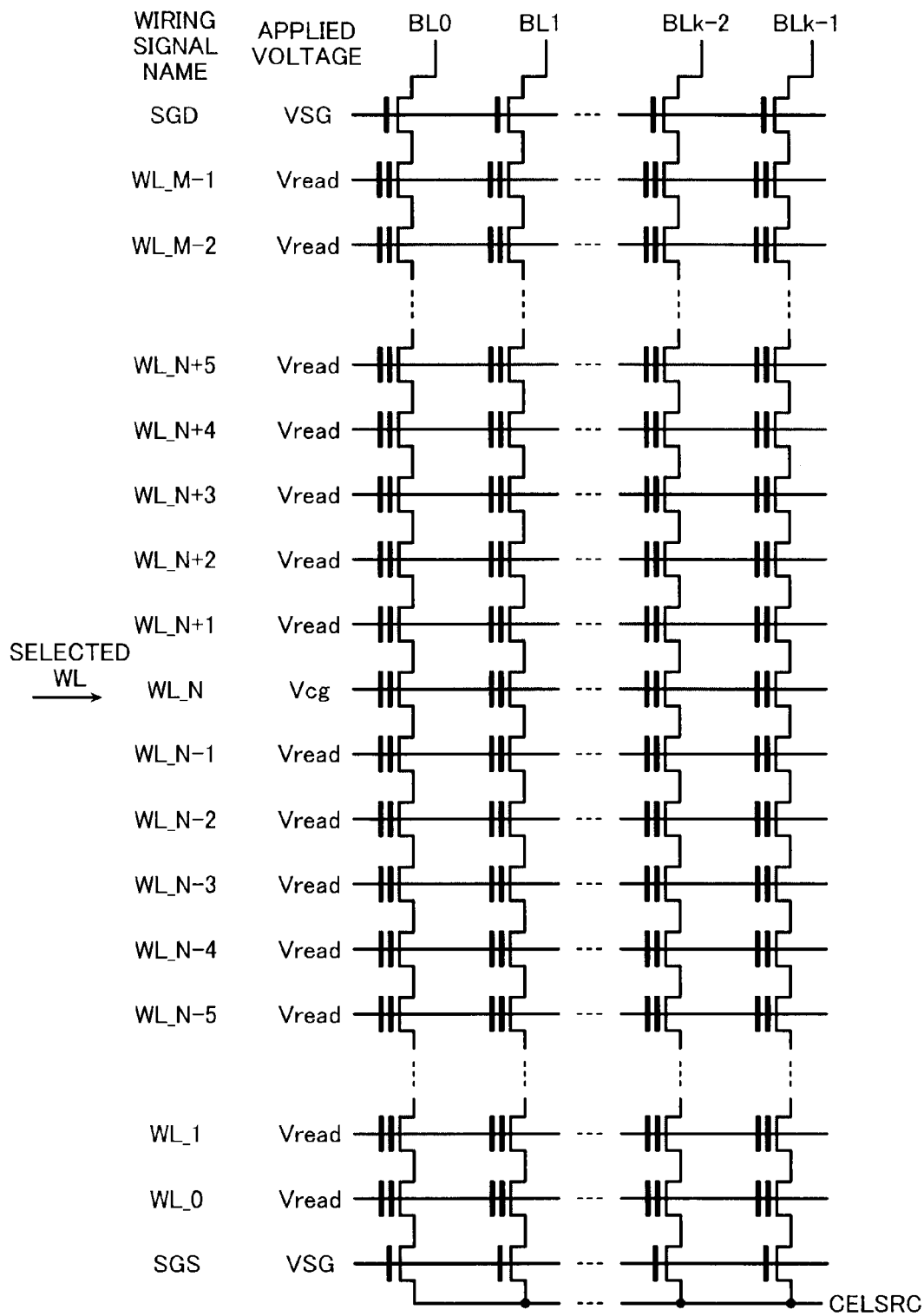
FIG. 31 is a figure illustrating an applied voltage during read process of a memory cell array according to a conventional reading method.

Two ways of voltage application methods are shown in a conventional read operation. One is a voltage application method as shown in FIG. 31. A voltage VSG (for example, 3.5 V) is applied to the selection gate lines SGD, SGS. A read voltage Vcg (for example, 0 V to 4 V) is applied to the selected word line WL_N. A read pass voltage Vread (for example, 7 V) for allowing conduction regardless of stored data in unselected memory cells is applied to unselected word lines WL_0 to WL_N−1 and WL_N+1 to WL_M−1.

However, in particular, when the half pitch of the word line WL becomes shorter than about 50 nm, the cell-to-cell interference becomes significant as described above. Therefore, with the read voltage Vcg applied to the selected word line WL_N, the floating gate of the unselected word lines WL_N−1 and WL_N+1 adjacent thereto are decreased to a level less than the original applied voltage, and this may cause read failure in which the unselected memory cells MC_N−1, MC_N+1 are not in conductive state.

Figure 32:
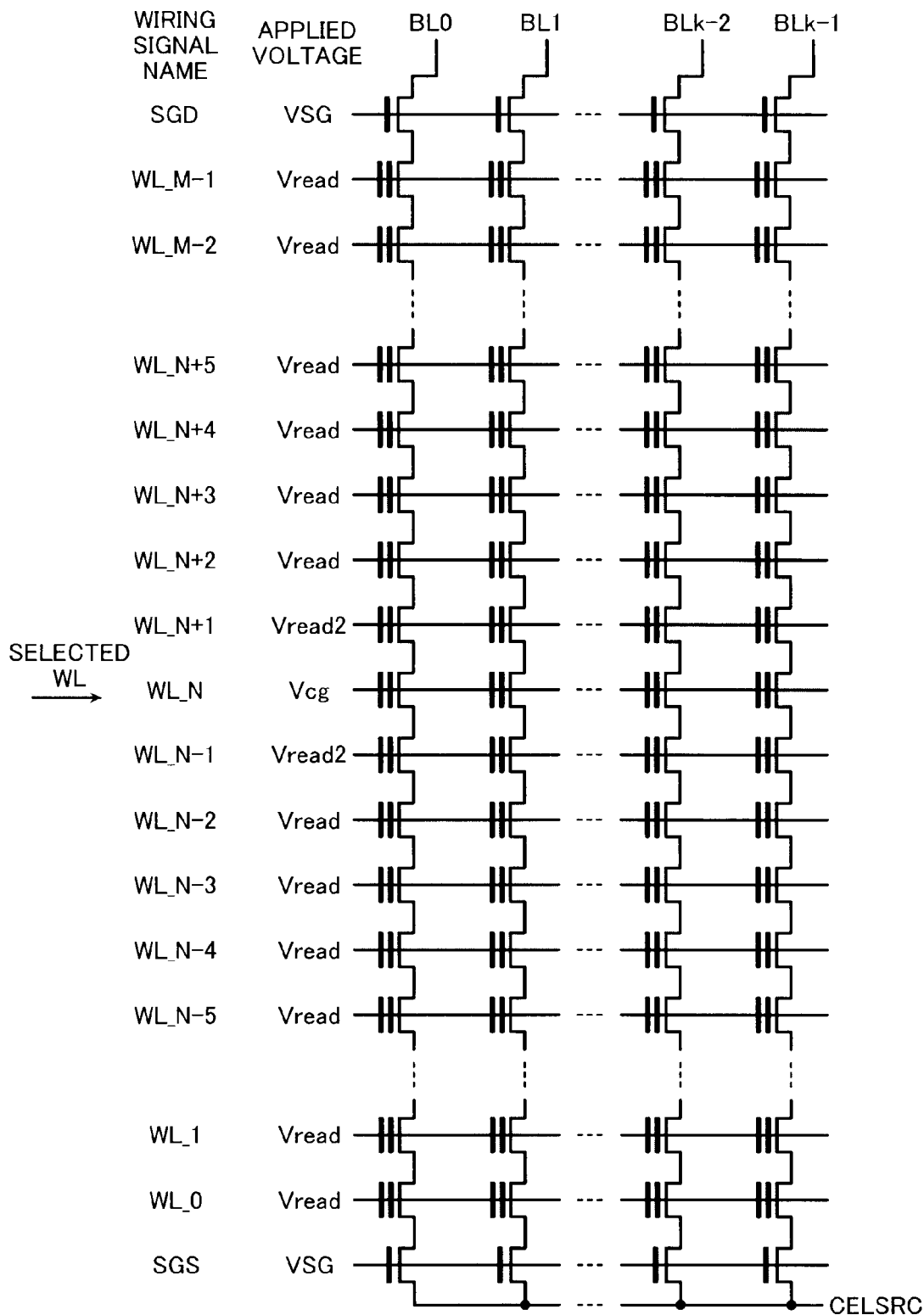
FIG. 32 is a figure illustrating an applied voltage during read process of a memory cell array according to another conventional reading method.

In this case, a second voltage application method as shown in FIG. 32 is also used. Where the selected word line is WL_N, the voltage VSG is applied to the selection gate lines SGS, SGD, the read voltage Vcg is applied to the selected word line WL_N, and a read pass voltage Vread2 (where Vread2>Vread, e.g., 8 V) is applied to the unselected word lines WL_N−1 and WL_N+1 adjacent to the selected word line WL_N. The read pass voltage Vread is applied to the unselected word lines WL_0 to WL_N−2 and WL_N+2 to WL_M−1 other than the unselected word lines WL_N−1 and WL_N+1.

According to the voltage application method, the cell-to-cell interference is reduced. That is, where a floating gate potential variation when the word line voltage of a certain object cell changes Δ is α·Δ, and a floating gate potential variation of a cell of an adjacent word line when a word voltage of the object cell changes Δ is β·Δ, α>β holds. In this case, where γ=β/α(<1) holds, the cell is more greatly affected by the interference caused by the adjacent cell as the size of the cell decreases. As a result, γ increases.

Now, the floating gate of the memory cell connected to the word line WL_N+4 is considered. In this case, the potential variation of the floating gate is almost proportional to the following expression.

$$V\text{read}+2\gamma \cdot V\text{read} \qquad \text{[Numerical expression 1]}$$

Subsequently, the floating gate of the memory cell connected to the word line WL_N+1 is considered. In this case, the potential variation of the floating gate is almost proportional to the following expression.

$$V\text{read2}+\gamma \cdot (V cg+V\text{read}) \qquad \text{[Numerical expression 2]}$$

When a low threshold value level is read out in read operation, the read voltage Vcg is less than Vread. Accordingly, the floating gate potential of the cell in the word line WL_N+1 is less than that of the cell in the word line WL_N+4 by the amount proportional to the following expression, i.e., difference between Numerical expression 1 and Numerical expression 2.

$$\gamma \cdot (V\text{read}-V cg)+(V\text{read}-V\text{read2}) \qquad \text{[Numerical expression 3]}$$

However, by increasing the read pass voltage Vread2 to a level more than Vread, the amount equivalent to γ·(Vread−Vcg) can be cancelled.

As the size decreases as described above, the space between the word lines WL becomes narrower, and the electric filed strength between the word lines WL and electric filed strength between the floating gate of an adjacent cell and the word line WL become lower.

On the other hand, as indicated in the Numerical expression 3, γ increases, and it is necessary to further increase the read pass voltage Vread2. As a result, in a read operation of a particularly lower threshold value level, the potential difference between the voltage Vcg of the selected word line WL_N and the read pass voltage Vread2 of the word lines WL_N−1 and WL_N+1 adjacent thereto increases, and the electric filed strength between the floating gate of an adjacent cell and the word line WL is required to meet stricter condition.

First Embodiment

Figure 5:
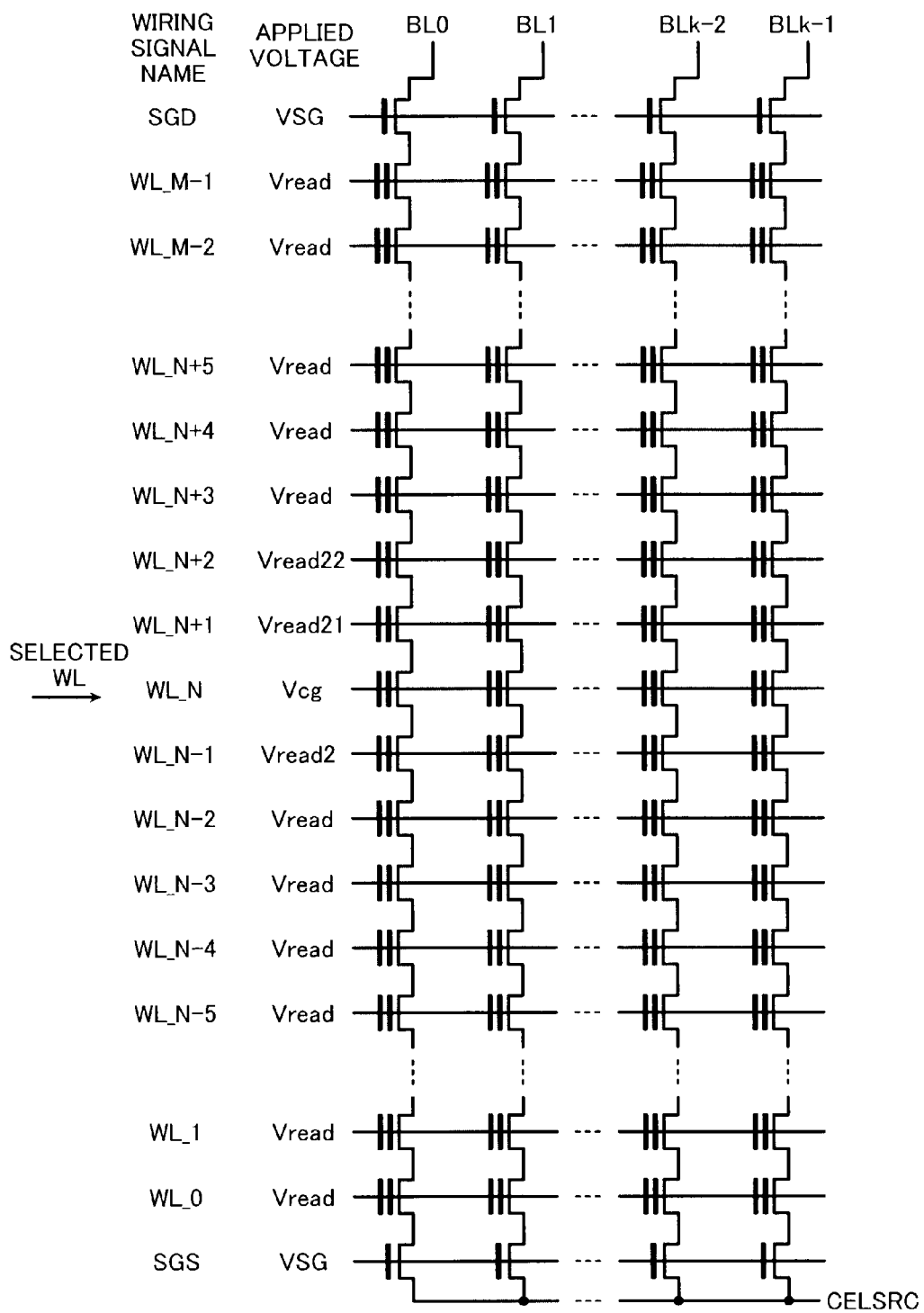
FIG. 5 is a figure illustrating an applied voltage during read process of a memory cell array according to a first embodiment.

Subsequently, the read operation according to a first embodiment will be explained with reference to FIG. 5. The present embodiment is different from the conventional read operation as shown in FIG. 32 in that read pass voltages Vread21 and Vread22 are respectively applied to unselected word lines WL_N+1 and WL_N+2 arranged in order from a selected word line WL_N at a drain-side (bit line side) of a memory cell array. In this case, the read pass voltages Vread21 and Vread22 are voltages higher than that of Vread but lower than that of Vread2.

According to this voltage application method, the potential variation of the floating gate of the memory cell connected to the word line WL_N+4 is the same as Numerical expression 1, but the potential variation of the floating gate of the memory cell connected to the word line WL_N+1 is almost proportional to the following expression.

$$V\text{read21}+\gamma \cdot (V cg+V\text{read22}) \qquad \text{[Numerical expression 4]}$$

Therefore, the floating gate potential of the cell in the word line WL_N+1 is less than that of the cell in the word line WL_N+4 by the amount proportional to the following expression, i.e., difference between Numerical expression 1 and Numerical expression 4.

$$\gamma \cdot \{(V\text{read}-V cg)+(V\text{read}-V\text{read22})\}+ (V\text{read}-V\text{read21}) \qquad \text{[Numerical expression 5]}$$

Therefore, when the Vread21 and Vread22 are set higher, the amount equivalent to γ·(Vread−Vcg) can be cancelled. When Numerical expression 3 and Numerical expression 5 are compared, it is understood as follows. In Numerical expression 3, the potential of the floating gate of the adjacent cell is compensated by adjusting only the read pass voltage Vread2 of the unselected word line WL_N+1. In Numerical expression 5, the potential of the floating gate of the adjacent cell can be compensated not only by increasing the read pass voltage Vread21 of the unselected word lines WL_N+1 to a level higher than the read pass voltage Vread but also by increasing the read pass voltage Vread22 of the unselected word line WL_N+2 to a level higher than the read pass voltage Vread. For this reason, the read pass voltage Vread21 at least can be maintained at a level lower than Vread2. Therefore, the potential difference between the adjacent word lines and the potential difference between the floating gate of the adjacent cell and the word line can be reduced, and the breakdown voltage can be alleviated.

When increments of the read pass voltages Vread2, Vread21 and Vread22 from Vread are denoted respectively as Δ2, Δ21 and Δ22, they can be expressed as follows.

$$V\text{read2}=V\text{read}+\Delta 2$$

$$V\text{read21}=V\text{read}+\Delta 21$$

$$V\text{read22}=V\text{read}+\Delta 22 \qquad \text{[Numerical expression 6]}$$

The following expression, i.e., condition in which the present embodiment and the conventional example as shown in FIG. 32 have almost the same potential variation of the floating gate of the selected word line WL_N+1, can be derived from Numerical expression 3, Numerical expression 5, and Numerical expression 6.

$$\Delta 2=\gamma \cdot \Delta 22+\Delta 21 (0<\gamma<1) \qquad \text{[Numerical expression 7]}$$

Therefore, Δ2>Δ22, Δ2>Δ21 hold, and Vread2>Vread21, Vread2>Vread22 hold. In addition, Vread21, Vread22 can be maintained at a voltage lower than Vread2.

In particular, the following expression is obtained from Numerical expression 7.

$$\Delta 21=\Delta 22=\Delta 2/(\gamma+1) \qquad \text{[Numerical expression 8]}$$

In this case, Vread21=Vread22<Vread2 substantially holds. In other words, the read pass voltage Vread21 applied to the unselected word line WL_N+1 adjacent to the selected word line WL_N can be at least maintained at a level lower than the read pass voltage Vread2, and moreover, Vread21=Vread22 holds. Therefore, without increasing the types of power supplies, the potential difference between the adjacent word lines can be reduced, and the problem of the breakdown voltage associated with downsizing can be avoided, so that the size of area of the circuit can be reduced, and the circuit can be simplified.

Second Embodiment

Figure 6:
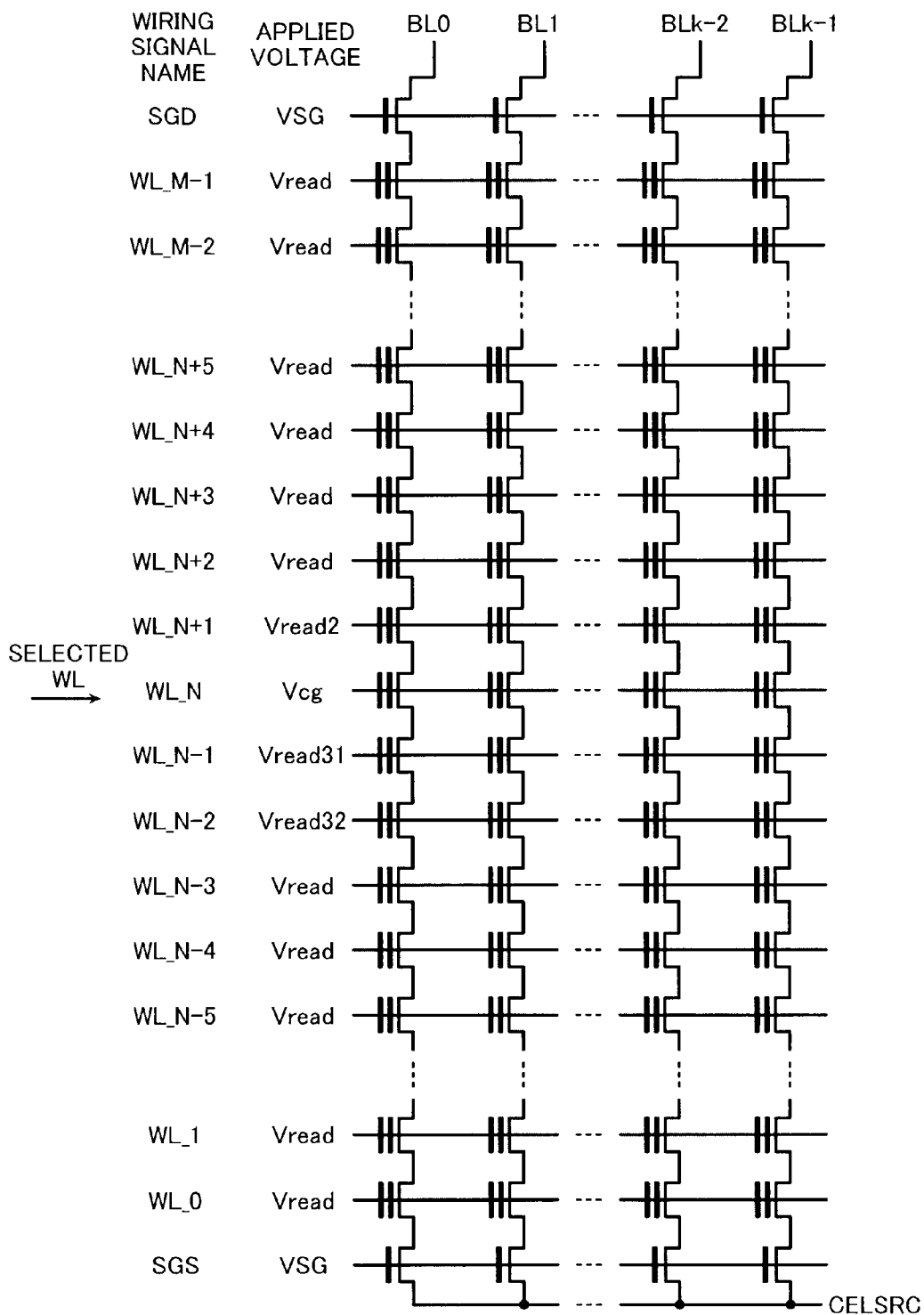
FIG. 6 is a figure illustrating an applied voltage during read process of a memory cell array according to a second embodiment.

Subsequently, a nonvolatile semiconductor memory device according to a second embodiment will be explained with reference to FIG. 6.

In the first embodiment, during data read process, the read pass voltages Vread21 and Vread22 lower than the read pass voltage Vread2 are given to the unselected word lines WL_N+1 and WL_N+2 at the drain-side (bit line side) of the memory cell array. In the second embodiment, the read pass voltages Vread31 and Vread32 are respectively applied to the unselected word line WL_N−1 and WL_N−2 at the side of the source line CSLSRC of the memory cell array.

Like the first embodiment, the second embodiment is also configured such that at least the voltage value of Vread31 itself can be maintained at a level lower than the read pass voltage Vread2. Therefore, the second embodiment achieves the same effects as those of the first embodiment.

Third Embodiment

Subsequently, a nonvolatile semiconductor memory device according to a third embodiment will be explained with reference to FIG. 7.

The present embodiment is a combination of the first embodiment and the second embodiment. That is, in the present embodiment, during data read process, the read pass voltages Vread21 and Vread22 lower than the read pass voltage Vread2 are given to the unselected word lines WL_N+1 and/or WL_N+2 at the drain-side (bit line side) of the memory cell array, and the read pass voltages Vread31 and Vread32 are respectively applied to the unselected word lines WL_N−1 and WL_N−2 at the side of the source line CSLSRC of the memory cell array.

In the present embodiment, the potential difference between the adjacent word lines can be reduced more greatly than the first and second embodiments as compared with the conventional reading method. In addition, the current consumption can be reduced due to the lower applied voltage.

Fourth Embodiment

Figure 8:
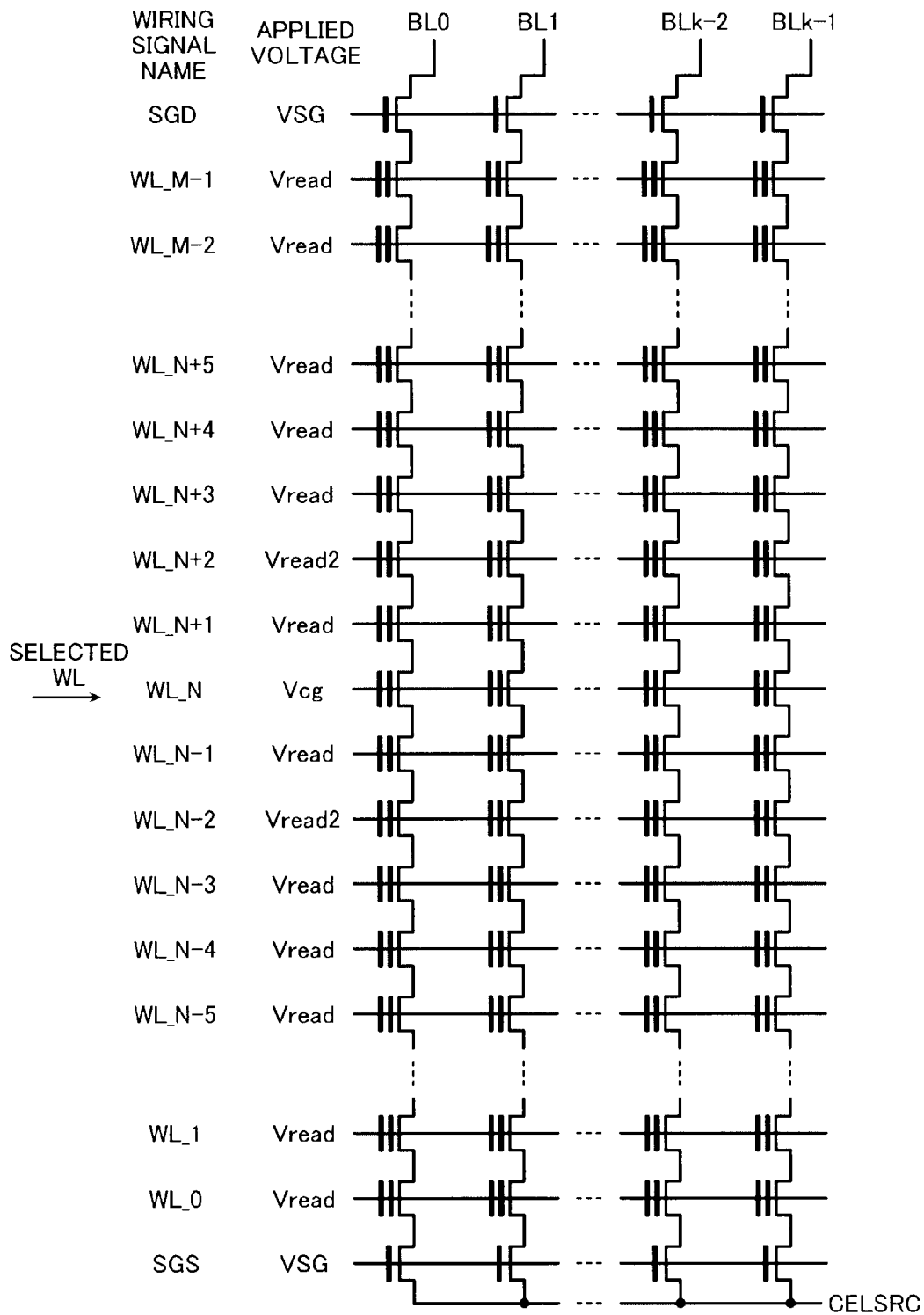
FIG. 8 is a figure illustrating an applied voltage during read process of a memory cell array according to a fourth embodiment.

Subsequently, a nonvolatile semiconductor memory device according to a fourth embodiment will be explained with reference to FIG. 8.

In the fourth embodiment, during data read process, the read pass voltage Vread is respectively applied to the unselected word lines WL_N−1 and WL_N+1 adjacent to the selected word line WL_N, the read pass voltage Vread2 higher than Vread is applied to the unselected word lines WL_N−2 and/or WL_N+2 further adjacent thereto, and the read pass voltage Vread is applied to the other unselected word lines WL_0 to WL_N−3 and WL_N+3 to WL_M−1.

In this embodiment, the voltage of the adjacent unselected word lines WL_N−1 and/or WL_N+1 reduced due to the read voltage Vcg of the selected word line WL_N is raised by applying the higher voltage Vread2 to the unselected word lines WL_N−2 and/or WL_N+2 adjacent thereto.

In this embodiment, the potential difference between the adjacent word lines can be reduced more greatly than the conventional reading method. Therefore, this embodiment achieves the same effects as those of the above-described embodiments. In the present embodiment, without increasing the types of power supplies as compared with the conventional reading method, the potential difference between the adjacent word lines can be reduced more greatly than the conventional reading method.

It should be noted that the voltages of the unselected word lines WL_N−1 and/or WL_N+1 may be set higher than Vread. In other words, even with the voltage Vread2 applied to the unselected word lines WL_N−2 and/or WL_N+2, the increase of the potential in the unselected word lines WL_N−1 and/or WL_N+1 may not be compensated. In this case, when the unselected word lines WL_N−1 and/or WL_N+1 are set at a level higher than Vread but equal to or less than Vread2, the potential difference between the adjacent word lines can be reduced more accurately than the conventional reading method.

Fifth Embodiment

Figure 9:
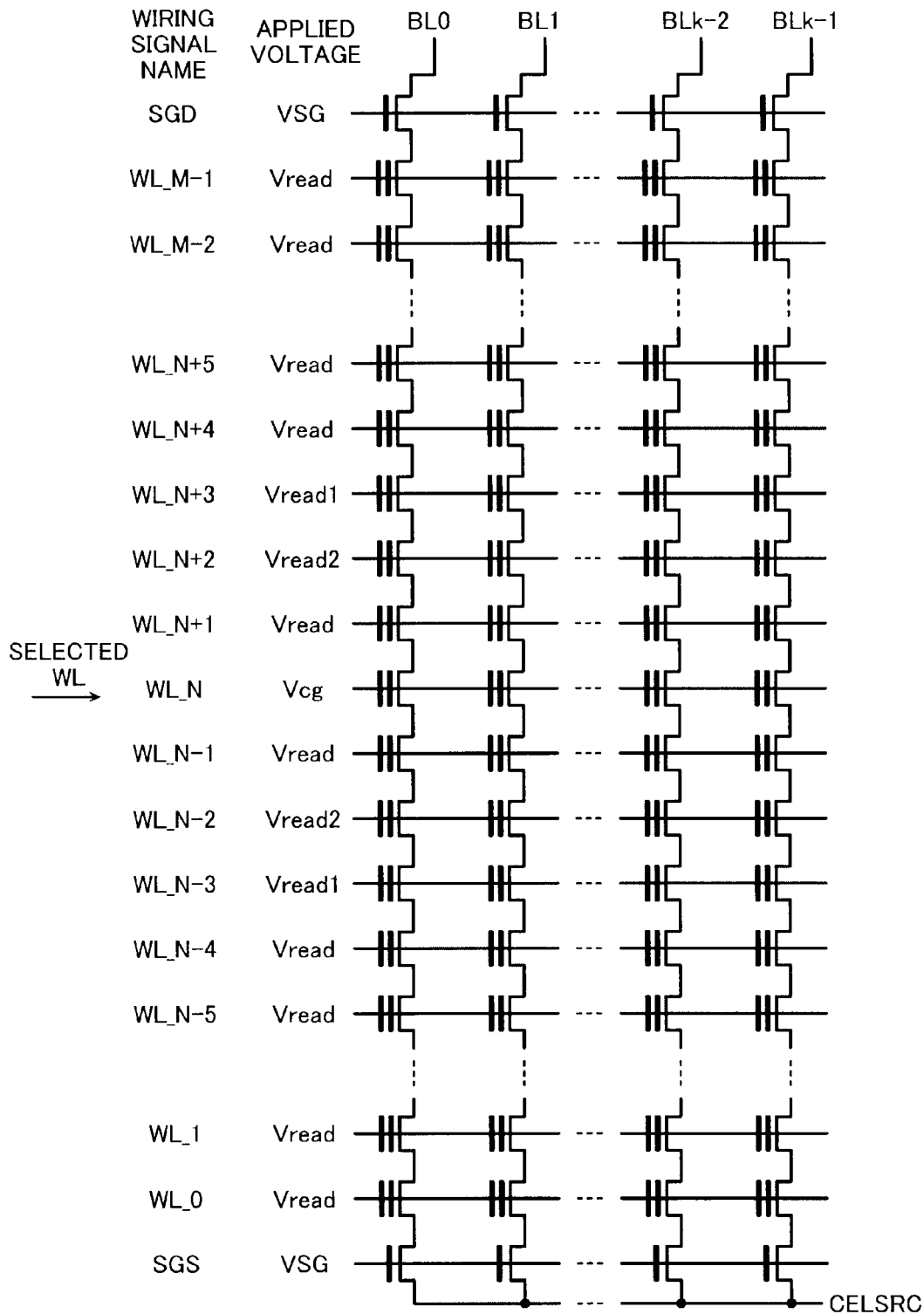
FIG. 9 is a figure illustrating an applied voltage during read process of a memory cell array according to a fifth embodiment.

Subsequently, a nonvolatile semiconductor memory device according to a fifth embodiment will be explained with reference to FIG. 9.

In this embodiment, in addition to the voltage application method during data read process in the fourth embodiment, a read pass voltage Vread1 lower than Vread is applied to the third unselected word lines WL_N−3 and/or WL_N+3 at the drain-side and the cell source-side with respect to the selected word line WL_N. In this configuration, excessive rises in the potentials of the floating gates of the memory cells connected to the unselected word lines WL_N−2 and/or WL_N+2 can be reduced with the unselected word lines WL_N−3 and/or WL_N+3 adjacent thereto.

When the voltages of the unselected word lines WL_N−2 and/or WL_N+2 rise more than necessary, electric field strength becomes as follows. When the threshold values of the memory cells connected to the unselected word lines WL_N−2 and WL_N+2 are lower, the electric field strength in the tunnel insulating film 43 increases. When the threshold values thereof are higher, the electric field strength in the inter-gate insulating film 45 increases. In this case, as read or write verification read process is repeated, the tunnel insulating film 43 or the inter-gate insulating film 45 of the memory cells connected to the unselected word lines WL_N−2 and WL_N+2 are likely to deteriorate.

Accordingly, the electric field strength in the tunnel insulating film 43 or the inter-gate insulating film 45 of the memory cells connected to the unselected word lines WL_N−2 and WL_N+2 is reduced by decreasing the potential of the unselected word lines WL_N−3 and WL_N+3 adjacent to the unselected word lines WL_N−2 and WL_N+2, thus preventing deterioration of the tunnel insulating film 43 or the inter-gate insulating film 45.

Alternatively, the voltages of the unselected word lines WL_N−1 and WL_N+1 may be increased to a level higher than Vread. In other words, even with the voltage Vread2 applied to the unselected word lines of WL_N−2 and WL_N+2, the increase of the potential in the unselected word lines WL_N−1 and WL_N+1 may not be compensated. In this case, when the unselected word lines WL_N−1 and WL_N+1 are set at a level higher than Vread but equal to or less than Vread2, the potential difference between the adjacent word lines can be reduced more accurately than the conventional reading method.

Sixth Embodiment

Figure 10:
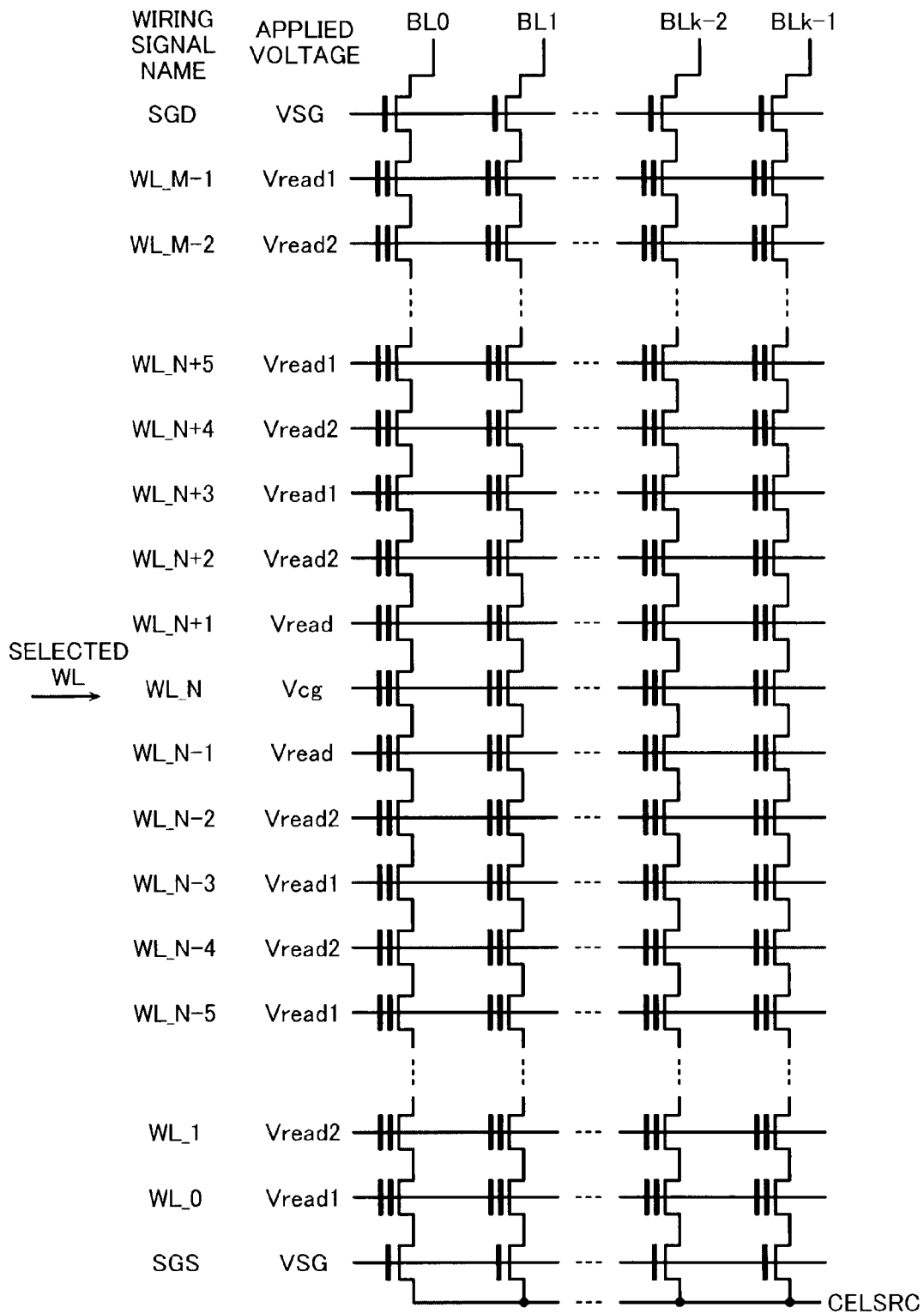
FIG. 10 is a figure illustrating an applied voltage during read process of a memory cell array according to a sixth embodiment.

Subsequently, a nonvolatile semiconductor memory device according to a sixth embodiment will be explained with reference to FIG. 10.

In this embodiment, in addition to the voltage application method during data read process in the fourth embodiment, a read pass voltage Vread1 lower than Vread and a read voltage Vread2 higher than Vread are alternately, respectively applied to third and subsequent unselected word lines WL_N−3 to WL_0 and WL_N+3 to WL_M−1 at the drain-side and the cell source-side with respect to the selected word line WL_N. In this configuration, the voltage of the floating gate excessively raised by the read pass voltage Vread2 is reduced with the adjacent word line, and the voltage of the floating gate excessively reduced by the read pass voltage Vread1 is raised with the adjacent word line, so that the changes of the potentials of the floating gates of the memory cells in the NAND strings are suppressed in whole.

In other words, with respect to the selected word line, the higher voltage is applied to the unselected word lines WL_N−even and WL_N+even, and the lower voltage is applied to the unselected word lines WL_N−odd and WL_N+odd.

As a result, this can prevent erroneous write process to the memory cells connected to the unselected word lines WL_N−even and WL_N+even. Further, the lower voltage is applied to the unselected word lines WL_N−odd and WL_N+odd, but the higher voltage (Vread2) is applied to the unselected word lines WL_N−even and WL_N+even. Accordingly, the memory cell transistors whose gate electrodes are connected to the unselected word lines WL_N−odd and WL_N+odd are not turned off.

That is, the reliability of all the memory cells of the NAND strings can be improved.

Alternatively, the voltages of the unselected word lines WL_N−1 and WL_N+1 may be increased to a level higher than Vread. In other words, even with the voltage Vread2 applied to the unselected word lines WL_N−2 and WL_N+2, the increase of the potential in the unselected word lines WL_N−1 and WL_N+1 may not be compensated. In this case, when the unselected word lines WL_N−1 and WL_N+1 is set at a level higher than Vread but equal to or less than Vread2, the potential difference between the adjacent word lines can be reduced more accurately than the conventional reading method.

Seventh Embodiment

Figure 11:
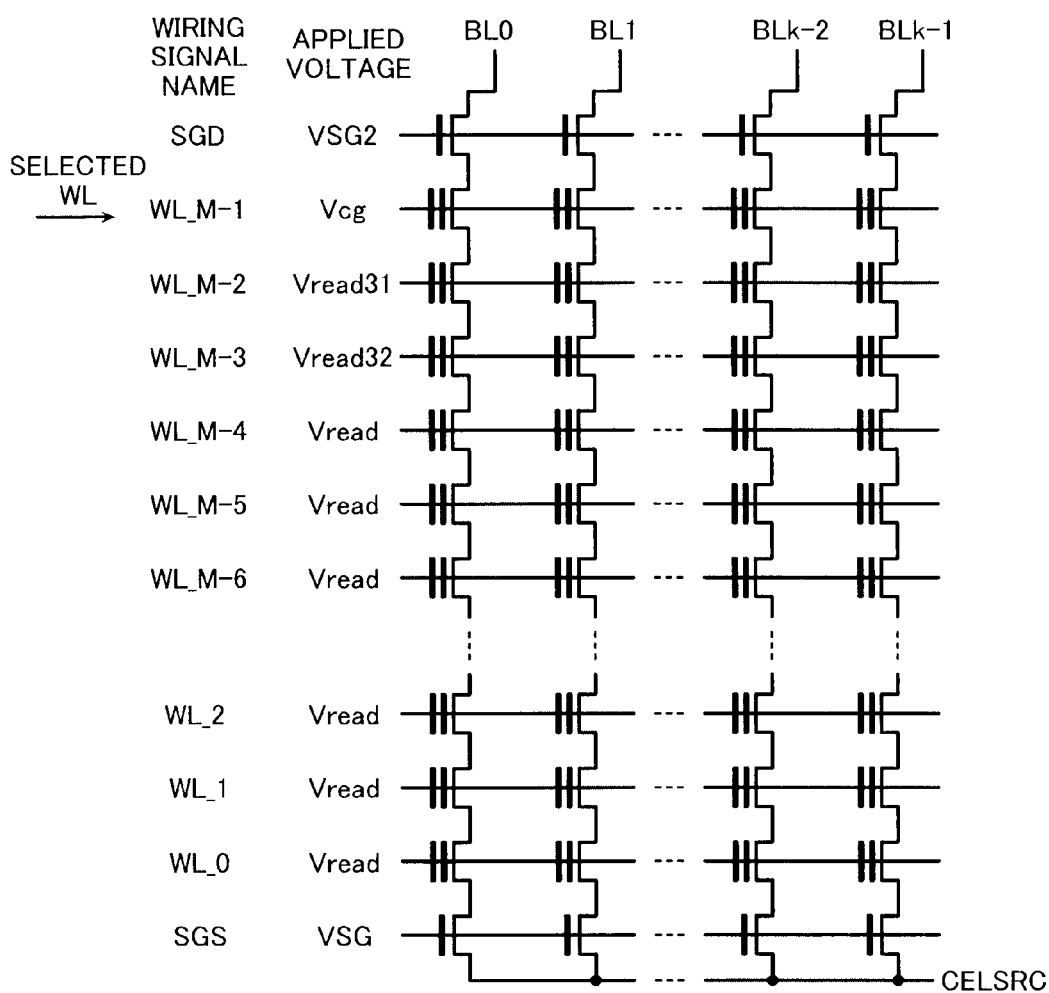
FIG. 11 is a figure illustrating an applied voltage during read process of a memory cell array according to a seventh embodiment.

Subsequently, a nonvolatile semiconductor memory device according to a seventh embodiment will be explained with reference to FIG. 11.

In the above embodiment, the selected word line WL_N is at the central portion of the NAND cell unit NU. However, in the present embodiment, the selected word line is at the end of the drain-side of the NAND cell unit NU.

Figure 7:
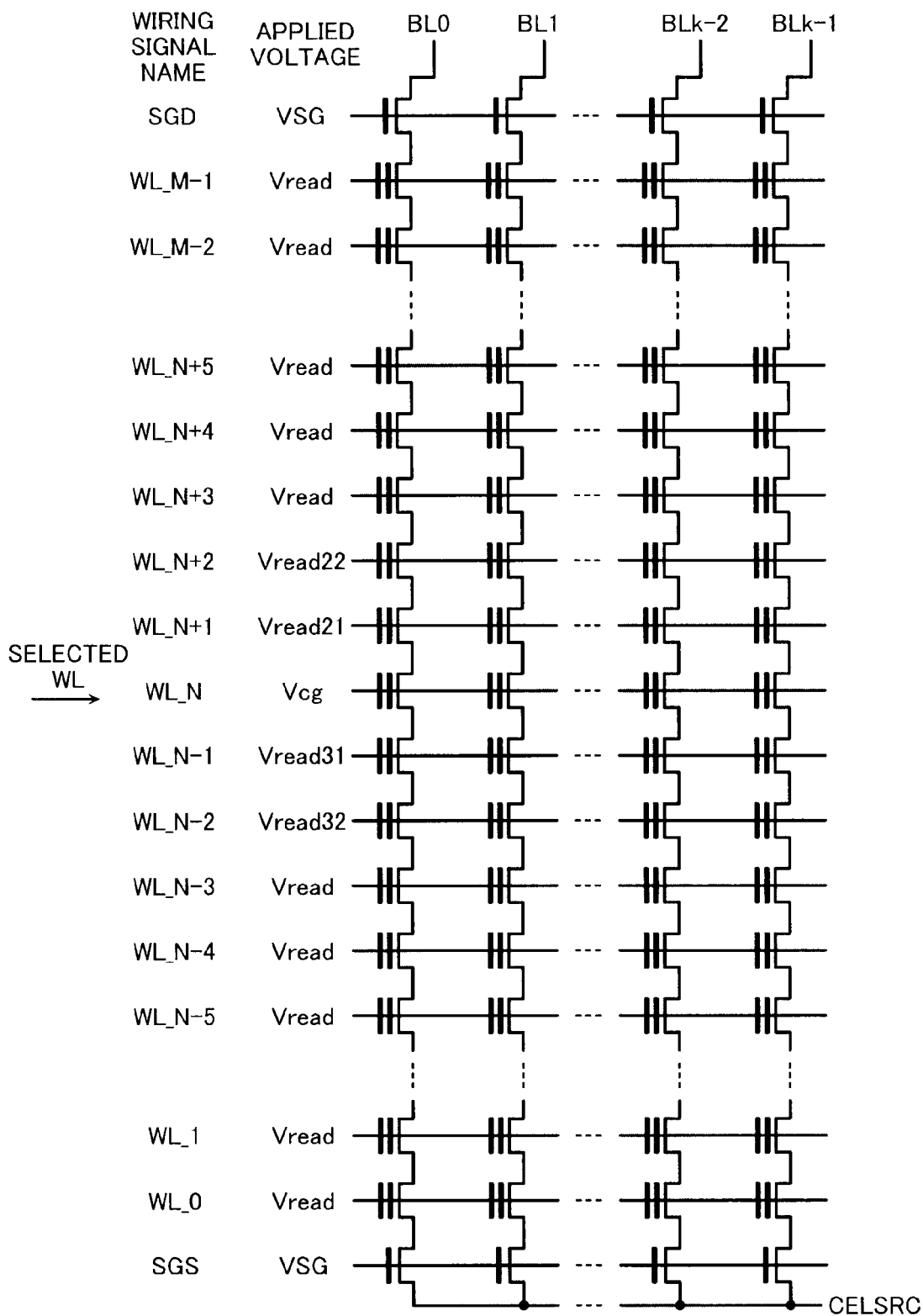
FIG. 7 is a figure illustrating an applied voltage during read process of a memory cell array according to a third embodiment.

This embodiment is different from the third embodiment as shown in FIG. 7 in that the selected word line is the word line WL_M−1 at the end of the drain-side, i.e., there is no word line at the drain-side with respect to the selected word line. The applied voltages applied to the unselected word lines WL_M−2, WL_M−3, . . . , WL_0, and the source-side selection gate line SGS are the same as those of the third embodiment.

The voltage applied to the drain-side selection gate SGD is preferably VSG2 (≥VSG). That is, in view of the electric filed strength, the voltage of the drain-side selection gate line SGD is preferably such that the potential difference between the selected word line WL_M−1 and the selection gate line SGD is small, and the selection gate line voltage VSG2 is preferably lower. When the reliability of the drain-side selection gate transistor S1 is considered, the voltage of the selection gate line voltage VSG2 is preferably lower. On the other hand, the interference with an adjacent cell is as follows. When data are written to the cells of the selected word line WL_M−1 (not in the erase state), the potential of the floating gate of the cell of the selected word line WL_M−1 is lower than the erase state, and therefore, the potential at the junction shared with the cell of the selected word line WL_M−1 decreases along with the downsizing. As a result, the ON current of the drain-side selection gate transistor is less likely to flow. In order to ensure the ON current of the drain-side selection gate transistor, the voltage VSG2 is preferably higher.

Therefore, the voltage VSG2 needs to be equal to or more than the voltage VSG. According to the applied structure of the NAND cell, when the reliability and the electric filed strength of the drain-side selection gate SGD can be ensured, the voltage VSG2 is desirably more than the voltage VSG, and when the reliability and electric filed strength of the drain-side selection gate SGD cannot be ensured, the voltage VSG2 is desirably the same as the voltage VSG.

Eighth Embodiment

Figure 12:
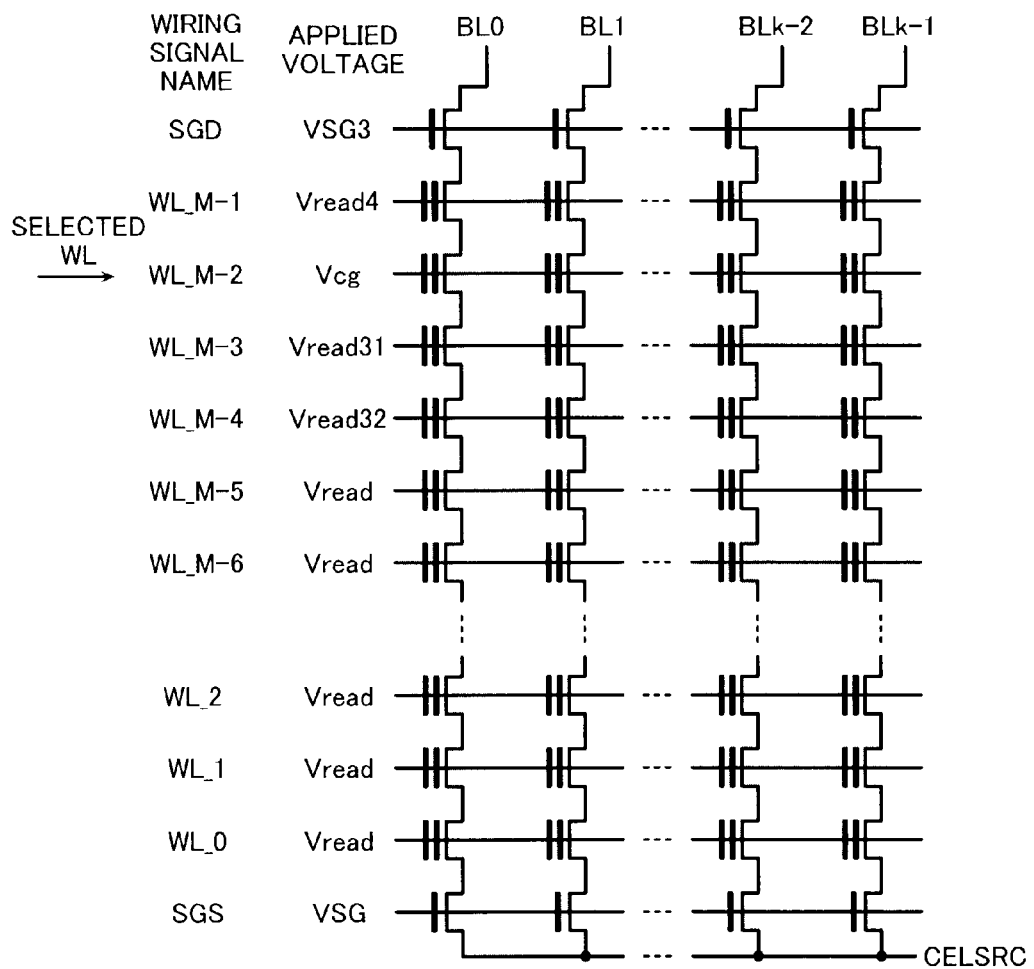
FIG. 12 is a figure illustrating an applied voltage during read process of a memory cell array according to an eighth embodiment.

Subsequently, a nonvolatile semiconductor memory device according to an eighth embodiment will be explained with reference to FIG. 12.

In this embodiment, a voltage application method for selecting and reading the second word line WL_M−2 from the end of the drain-side will be shown. This embodiment is different from the third embodiment as shown in FIG. 7 in that there is only one word line at the drain-side with respect to the selected word line. The applied voltages applied to the unselected word lines WL_M−3, WL_M−4, WL_0, and the source-side selection gate line SGS are the same as those of the third embodiment.

A voltage Vread4 is applied to the unselected word line WL_M−1 at the drain-side with respect to the selected word line WL_M−2. In this case, there is only one word line at the drain-side with respect to the selected word line, and therefore, the unselected word line WL_M−1 cannot attain a voltage application state such as that of the source-side. Therefore, the same voltage as the read pass voltage Vread2 is desirably applied as the read pass voltage Vread4.

However, since the voltage of the selection gate line SGD adjacent to the unselected word line WL_M−1 is less than the read pass voltage Vread, the potential of the floating gate of the cell of the unselected word line WL_M−1 is less likely to increase along with the downsizing. Therefore, the voltage Vread4 is desirably equal to or more than the voltage Vread2.

Further, the voltage applied to the drain-side selection gate line SGD is desirably VSG3 (≥VSG). That is, in view of the electric field strength, the voltage of the selection gate line SGD is preferably such that the potential difference between the adjacent word line WL_M−1 and the selection gate line SGD is smaller, and the voltage VSG3 is preferably high. As described above, even in view of the interference with the adjacent cell, the voltage VSG3 is preferably higher. On the other hand, in view of the reliability of the drain-side selection gate transistor S1, the voltage VSG3 is preferably lower.

Therefore, the voltage VSG3 needs to be equal to or more than the voltage VSG. According to the applied structure of the NAND cell, when the reliability can be ensured, the voltage VSG3 is desirably more than the voltage VSG, and when the reliability is severe, the voltage VSG3 is desirably the same as the voltage VSG.

Ninth Embodiment

Figure 13:
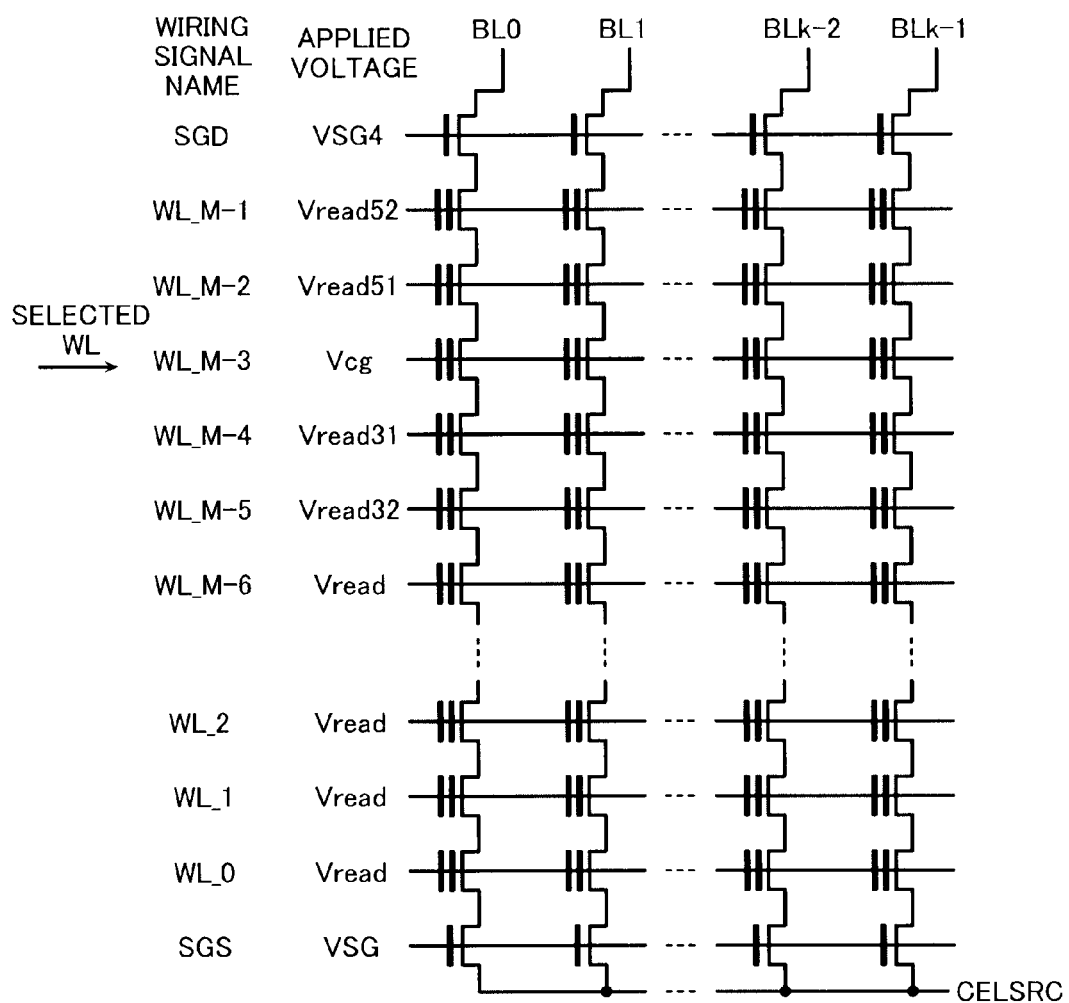
FIG. 13 is a figure illustrating an applied voltage during read process of a memory cell array according to a ninth embodiment.

Subsequently, a nonvolatile semiconductor memory device according to a ninth embodiment will be explained with reference to FIG. 13.

In this embodiment, a voltage application method for selecting and reading the third word line WL_M−3 from the drain-side will be shown. This embodiment is different from the third embodiment as shown in FIG. 7 in that there are only two word lines at the drain-side with respect to the selected word line. The applied voltages applied to the unselected word lines WL_M−4, WL_M−5, . . . , WL_0, and the source-side selection gate line SGS are the same as those of the third embodiment.

Voltages Vread51, Vread52 are applied to the unselected word lines WL_M−2 and WL_M−1 at the drain-side with respect to the selected word line WL_M−3. In this case, Vread<Vread51<Vread2 and Vread52>Vread hold. In this case, there are only two word lines at the drain-side with respect to the selected word line, and the voltage of the selection gate line SGD adjacent to the word line WL_M−1 is less than the voltage Vread as described above. Therefore, the potential of the floating gate of the cell of the unselected word line WL_M−1 is less likely to increase along with the downsizing.

Therefore, as shown in the third embodiment, the voltage Vread52 is higher than the voltage Vread, but is desirably the same as the voltage Vread22 or higher than Vread22.

Further, the voltage applied to the drain-side selection gate line SGD is desirably VSG4 (≥VSG). Like the above embodiment, the voltage VSG4 needs to be equal to or more than the voltage VSG. According to the applied structure of the NAND cell, when the reliability can be ensured, the voltage VSG4 is desirably more than the voltage VSG, and when the reliability is severe, the voltage VSG4 is desirably the same as the voltage VSG.

When the word line WL_M−4 at the fourth or higher line from the drain-side is selected, the voltage application method to the unselected word lines WL_M−3 to WL_M−1 and the selection gate line SGD at the drain-side with respect to the selected word line WL_M−4 is the same as that of the third embodiment.

Tenth Embodiment

Figure 14:
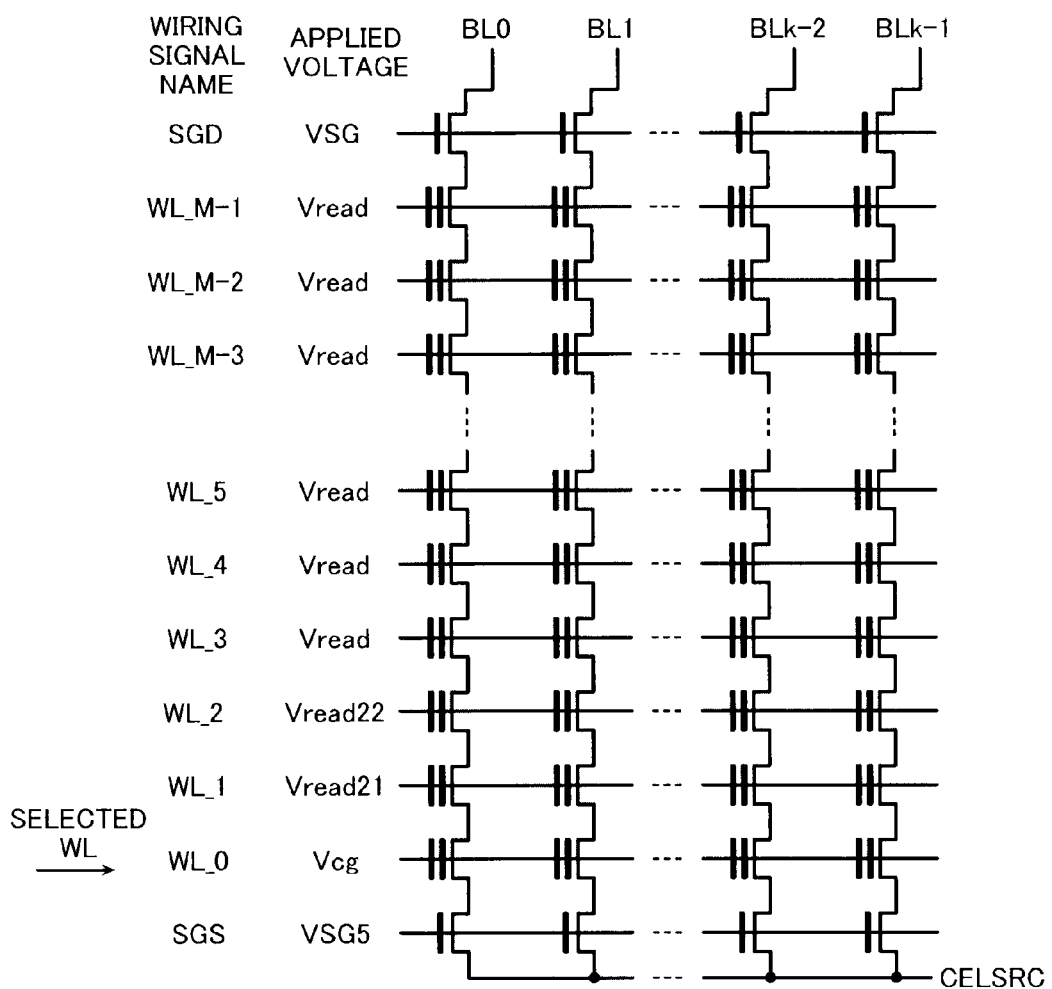
FIG. 14 is a figure illustrating an applied voltage during read process of a memory cell array according to a tenth embodiment.

Subsequently, a nonvolatile semiconductor memory device according to a tenth embodiment will be explained with reference to FIG. 14.

In this embodiment, the selected word line is at the end of the cell source-side of the NAND cell unit NU.

This embodiment is different from the third embodiment as shown in FIG. 7 in that the selected word line is the word line WL_0 at the end of the cell source-side, i.e., there is no word line at the source-side with respect to the selected word line. The applied voltages applied to the unselected word lines WL_1, WL_2, . . . , WL_M−1, and the drain-side selection gate line SGD are the same as those of the third embodiment.

Further, like the seventh to ninth embodiments, the voltage VSG5 applied to the source-side selection gate SGS needs to be equal to or more than the voltage VSG. According to the applied structure of the NAND cell, when the reliability and the electric filed strength of gate insulator in the source-side selection gate SGS can be ensured, the voltage VSG5 is desirably more than the voltage VSG, and when the reliability and the electric filed strength of gate insulator in the source-side selection gate SGS cannot be ensured, the voltage VSG5 is desirably the same as the voltage VSG.

Eleventh Embodiment

Figure 15:
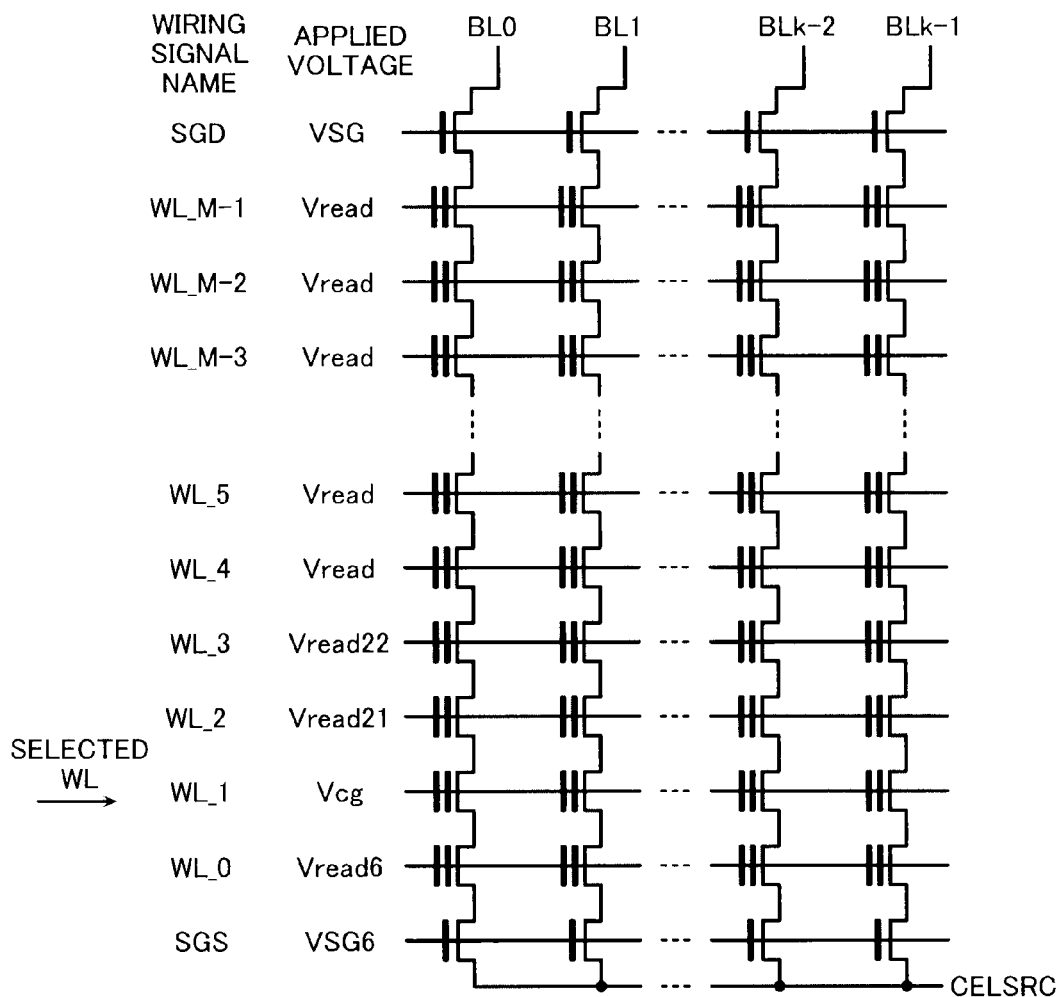
FIG. 15 is a figure illustrating an applied voltage during read process of a memory cell array according to an eleventh embodiment.

Subsequently, a nonvolatile semiconductor memory device according to an eleventh embodiment will be explained with reference to FIG. 15.

In this embodiment, a voltage application method for selecting and reading the second word line WL_1 from the end of the cell source-side will be shown. This embodiment is different from the third embodiment as shown in FIG. 7 in that there is only one word line at the source-side with respect to the selected word line. The applied voltages applied to the unselected word lines WL_2, WL_3, . . . , WL_M−1, and the drain-side selection gate line SGD are the same as those of the third embodiment.

A voltage Vread6 is applied to the unselected word line WL_0 at the source-side with respect to the selected word line WL_1. In this case, there is only one word line at the source-side with respect to the selected word line, and therefore, the unselected word line WL_0 cannot attain a voltage application state such as that of the drain-side. Therefore, the same voltage as the read pass voltage Vread2 is desirably applied as the read pass voltage Vread6.

However, since the voltage of the selection gate line SGS adjacent to the unselected word line WL_0 is less than the read pass voltage Vread, the potential of the floating gate of the cell of the unselected word line WL_0 is less likely to increase along with the downsizing. Therefore, the voltage Vread6 is desirably equal to or more than the voltage Vread2.

Further, like the seventh to ninth embodiments, the voltage VSG6 applied to the cell source-side selection gate line SGS needs to be equal to or more than the voltage VSG. According to the applied structure of the NAND cell, when the reliability can be ensured, the voltage VSG6 is desirably more than the voltage VSG, and when the reliability is severe, the voltage VSG6 is desirably the same as the voltage VSG.

Twelfth Embodiment

Figure 16:
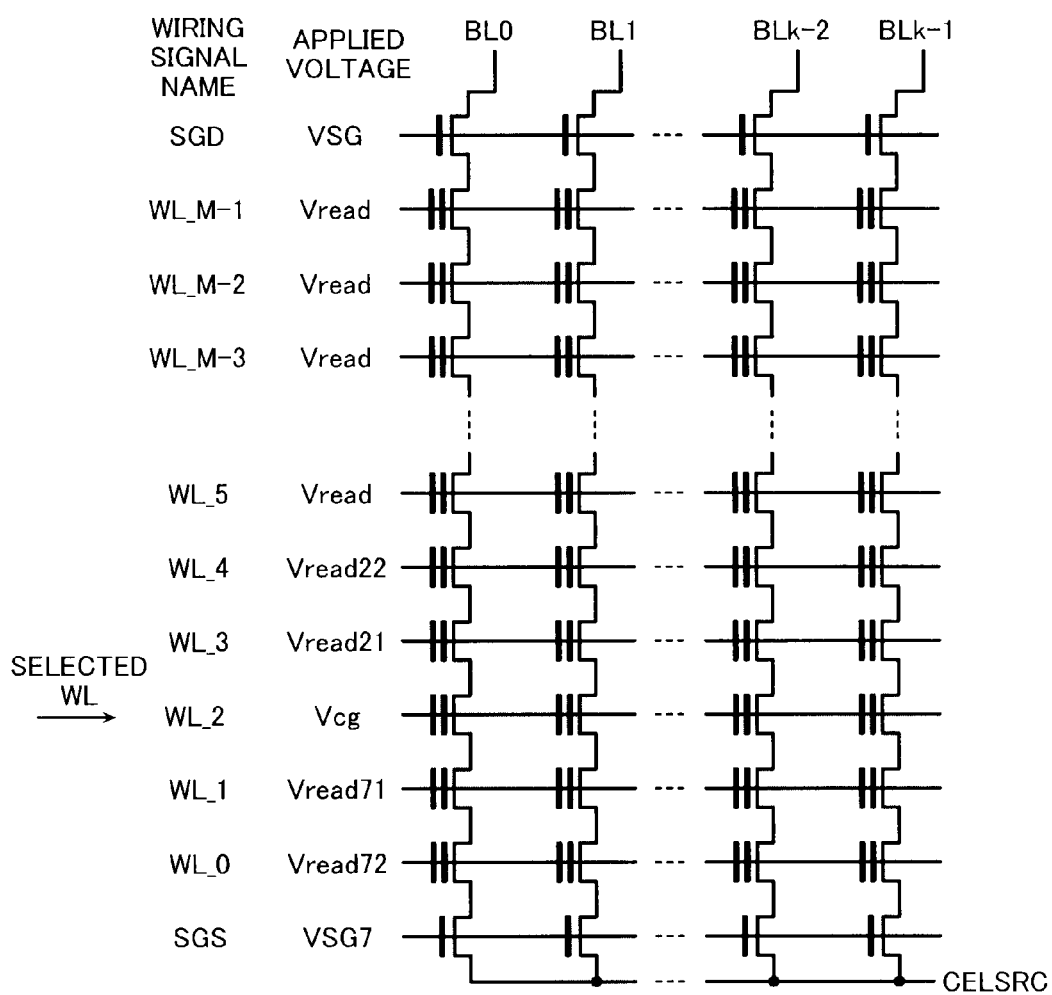
FIG. 16 is a figure illustrating an applied voltage during read process of a memory cell array according to a twelfth embodiment.

Subsequently, a nonvolatile semiconductor memory device according to a twelfth embodiment will be explained with reference to FIG. 16.

In this embodiment, a voltage application method for selecting and reading the third word line WL_2 from the source-side will be shown. This embodiment is different from the third embodiment as shown in FIG. 7 in that there are only two word lines at the source-side with respect to the selected word line. The applied voltages applied to the unselected word lines WL_3, WL_4, . . . , WL_M−1, and the drain-side selection gate line SGD are the same as those of the third embodiment.

Voltages Vread71, Vread72 are applied to the unselected word lines WL_1 and WL_0 at the source-side with respect to the selected word line WL_2. In this case, Vread<Vread71<Vread2, Vread72>Vread hold. In this case, there are only two word lines at the source-side with respect to the selected word line, and the voltage of the selection gate line SGS adjacent to the word line WL_0 is less than the voltage Vread as described above. Therefore, the potential of the floating gate of the cell of the unselected word line WL_0 is less likely to increase along with the downsizing.

Therefore, as shown in the third embodiment, the voltage Vread72 is higher than the voltage Vread, but is desirably the same as the voltage Vread32 or higher than Vread32.

Further, like the seventh to ninth embodiment, the voltage VSG7 applied to the source-side selection gate line SGS needs to be equal to or more than the voltage VSG. According to the applied structure of the NAND cell, when the reliability can be ensured, the voltage VSG7 is desirably more than the voltage VSG, and when the reliability is severe, the voltage VSG7 is desirably the same as the voltage VSG.

Further, it is to be understood that the voltages VSG2 to VSG7 desirably have as few types of voltages as possible, so that the circuit can be simplified, and the size of area of the circuit can be reduced. Likewise, the voltages Vread21, Vread22, Vread51, Vread52, Vread71, Vread72 desirably have as few types of voltages as possible. Likewise, Vread2, Vread4, Vread7 desirably have as few types of voltages as possible.

Thirteenth Embodiment

Subsequently, a nonvolatile semiconductor memory device according to a thirteenth embodiment will be explained with reference to FIG. 17.

In the above embodiments, all the memory cells in the memory cell array are used for data storage. On the other hand, in recent years, as the sizes of devices are reduced, the characteristics of memory cells connected to a word line adjacent to a selection gate are different more greatly than other memory cells. Accordingly, in some cases, the word line adjacent to the selection gate is used as a dummy word line, and the memory cells connected to the dummy word line operate as dummy cells which are not used for data storage (K. Kanda et al., "A 120 mm2 16 Gb 4 Multi Level NAND Flash Memory with 43 nm CMOS Technology", ISSCC Dig. Tech. Papers, pp. 430-431, February 2008.).

In the present embodiment, for example, the word lines WL_0 and WL_M−1 adjacent to the selection gate lines SGS, SGD at both of the source-side and the drain-side are adopted as dummy word lines. However, the same effects can be obtained even when only a word line adjacent to at least one of the selection gate lines SGS, SGD at the source-side and the drain-side is adopted as a dummy word line. Even when there are a plurality of dummy word lines adjacent to at least one of the source-side and the drain-side, the same effects can be obtained.

Figure 17:
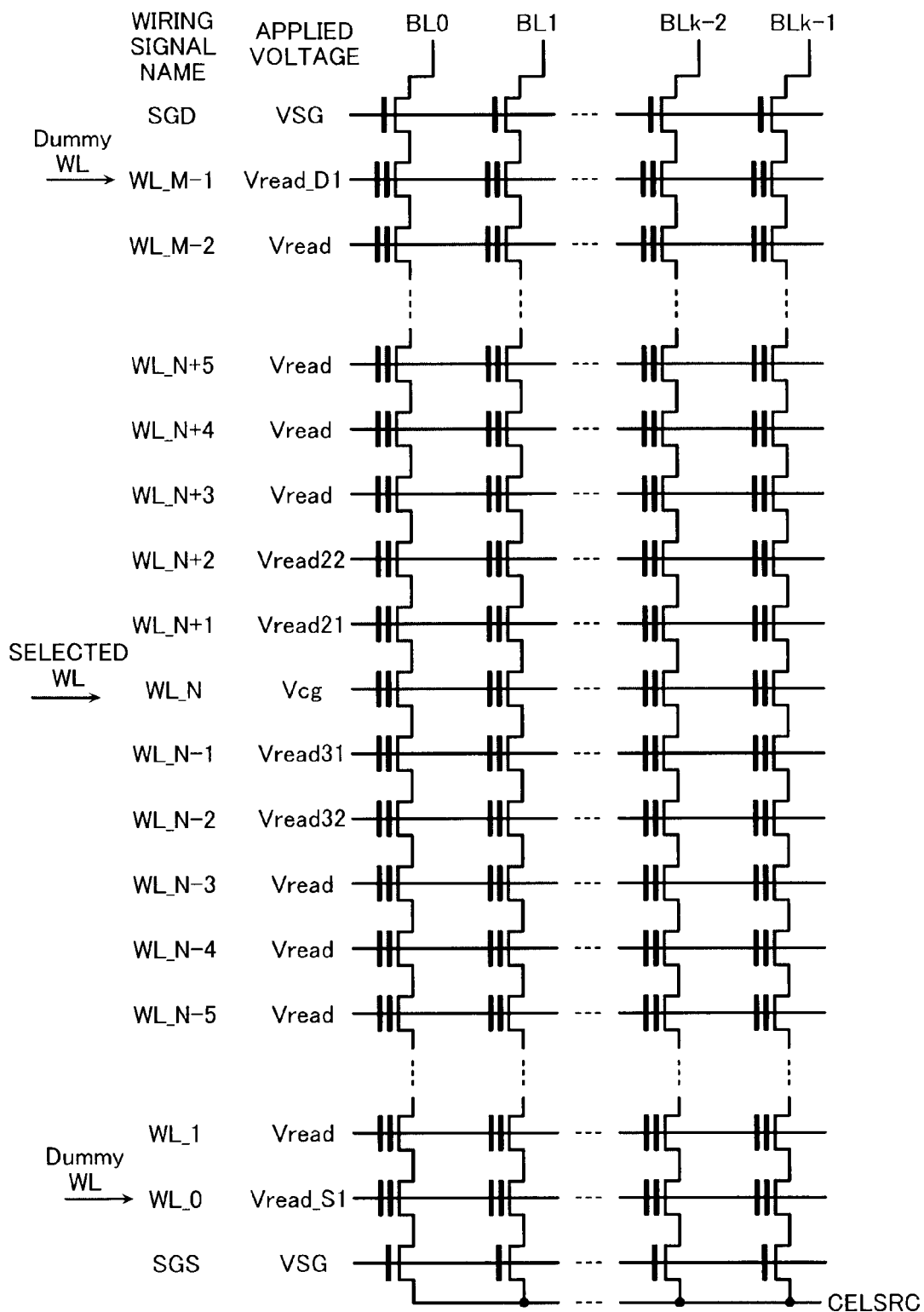
FIG. 17 is a figure illustrating an applied voltage during read process of a memory cell array according to a thirteenth embodiment.

FIG. 17 illustrates a voltage application method during read operation according to the present embodiment.

Memory cells connected to the dummy word line (dummy cells) do not store any data, and therefore, the dummy cells may be in erase state. When the dummy cells are in erase state, the dummy cells can be in conductive state even if the voltage of the dummy word line is low.

This means that the potential difference between the selection gate lines SGD, SGS and the dummy word lines WL_M−1 and WL_0 adjacent thereto can be easily suppressed. Therefore, voltages are desirably applied to the dummy word lines WL_0 and WL_M−1 so that the voltages become the read pass voltages Vread_S1, Vread_D1, respectively (where Vread_S1>VSG, Vread_D1<Vread).

In this case, the present embodiment is a modification of the third embodiment. However, the same effects can also be obtained even when the present embodiment is made as a modification of the first or second embodiment.

Fourteenth Embodiment

Subsequently, a nonvolatile semiconductor memory device according to a fourteenth embodiment will be explained with reference to FIG. 18.

Like the thirteenth embodiment, this embodiment shows a voltage application method using a dummy word line wherein a selected word line is a word line at the end portion at the drain-side.

In the present embodiment, the word lines WL_0 and WL_M−1 adjacent to the selection gate lines SGS, SGD at both of the source-side and the drain-side are adopted as dummy word lines. However, the same effects can be obtained even when only a word line adjacent to at least one of the selection gate lines at the source-side and the drain-side is adopted as a dummy word line.

Figure 18:
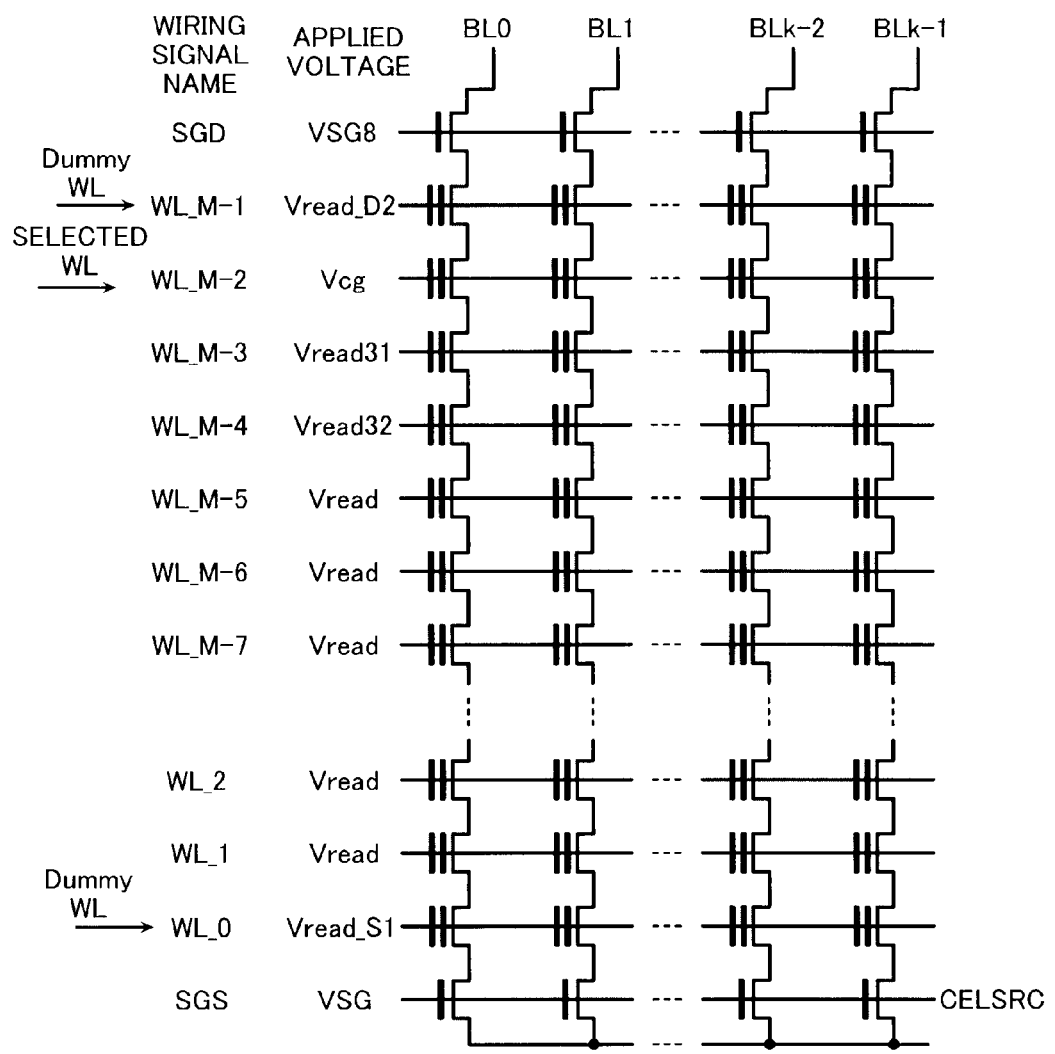
FIG. 18 is a figure illustrating an applied voltage during read process of a memory cell array according to a fourteenth embodiment.

As shown in FIG. 18, the selected word line is the second word line WL_M−2 from the drain-side. The present embodiment is different from FIG. 17 in that there is only the dummy word line WL_M−1 at the drain-side with respect to the selected word line.

The applied voltages of the other word lines WL_M−3, WL_M−4, ..., WL_0 and the selection gate line SGS are the same as those of the thirteenth embodiment.

A voltage Vread_D2 (≥Vread_D1) is applied to the dummy word line WL_M−1. In this case, since there is only one word line (dummy word line WL_M−1) at the drain-side with respect to the selected word line, it is desirable to follow the voltage application method in the conventional example as shown in FIG. 32.

However, the dummy cell may be in erase state. When the dummy cell is in erase state, the threshold value (Vth) is low, and it is not necessary to increase the voltage to a level as high as Vread4 of FIG. 12. The voltage of Vread_D2 may be determined within a range equal to or more than Vread_D1 according to the applied structure of the NAND cell.

The voltage VSG8 applied to the drain-side selection gate SGD needs to be equal to or more than the voltage VSG, but according to the voltage Vread_D2 and the applied structure of the NAND cell, when the reliability and the electric filed strength of gate insulator in the drain-side selection gate SGD can be ensured, the voltage VSG8 is desirably more than the voltage VSG, and when the reliability and the electric filed strength of gate insulator in the drain-side selection gate SGD cannot be ensured, the voltage VSG8 is desirably the same as the voltage VSG.

Fifteenth Embodiment

Figure 19:
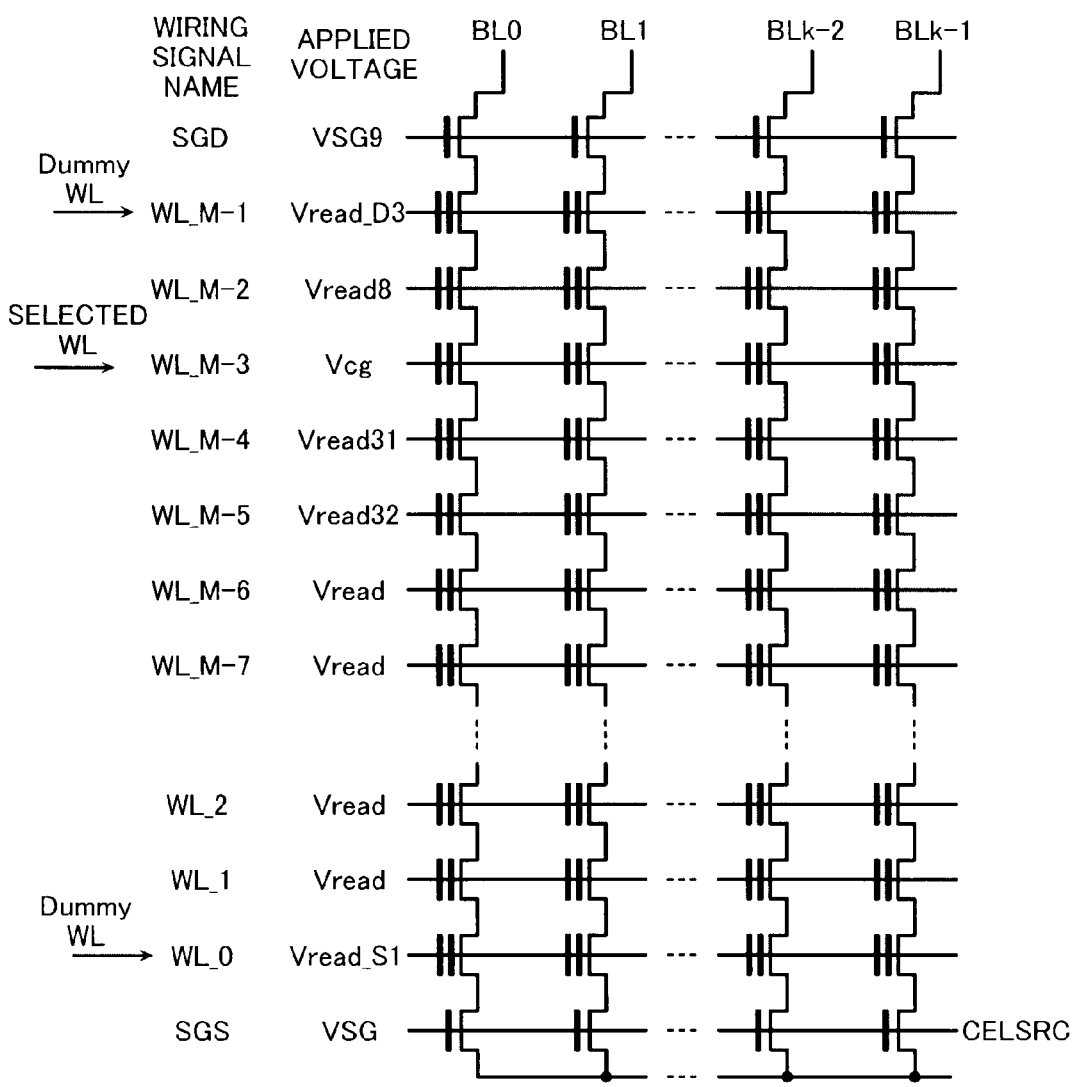
FIG. 19 is a figure illustrating an applied voltage during read process of a memory cell array according to a fifteenth embodiment.

Subsequently, a nonvolatile semiconductor memory device according to a fifteenth embodiment will be explained with reference to FIG. 19.

Like the thirteenth embodiment, this embodiment shows a voltage application method using a dummy word line wherein a selected word line is the third word line WL_M−3 from the end portion at the drain-side. The present embodiment is different from FIG. 17 in that there are only the dummy word line WL_M−1 and the unselected word line WL_M−2 at the drain-side with respect to the selected word line.

The applied voltages of the other word lines WL_M−4, WL_M−5, ..., WL_0 and the selection gate line SGS are the same as those of the thirteenth embodiment.

A voltage Vread_D3 (≤Vread_D1) is applied to the dummy word line WL_M−1. A voltage Vread8 (Vread<Vread8<Vread2) is applied to the unselected word line WL_M−2 at the drain-side. Since the read voltage Vcg is low, the read pass voltage Vread8 needs to be set somewhat higher, but in order to reduce the potential difference between the cells, the voltage Vread_D3 is desirably set at a value higher than Vread_D1 so that the read pass voltage Vread8 is set at a voltage as low as possible.

On the other hand, the voltage VSG9 applied to the drain-side selection gate line SGD needs to be equal to or more than the voltage VSG, but according to the voltage Vread_D3 and the applied structure of the NAND cell, when the reliability and the electric filed strength of gate insulator in the drain-side selection gate SGD can be ensured, the voltage VSG9 is desirably more than the voltage VSG, and when the reliability and the electric filed strength of gate insulator in the drain-side selection gate SGD voltage cannot be ensured, the voltage VSG9 is desirably the same as the voltage VSG.

Sixteenth Embodiment

Figure 20:
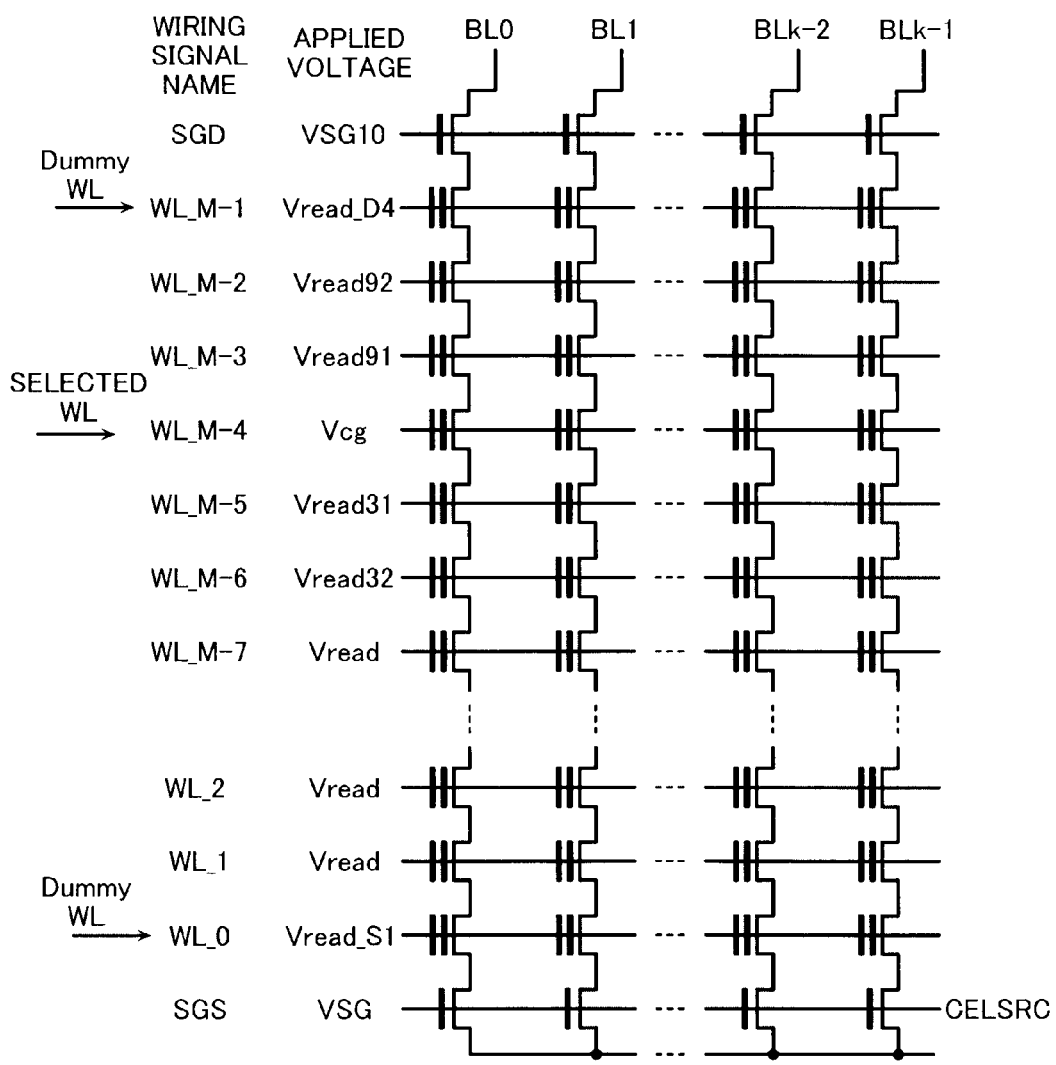
FIG. 20 is a figure illustrating an applied voltage during read process of a memory cell array according to a sixteenth embodiment.

Subsequently, a nonvolatile semiconductor memory device according to a sixteenth embodiment will be explained with reference to FIG. 20.

Like the thirteenth embodiment, this embodiment shows a voltage application method using a dummy word line wherein a selected word line is the fourth word line WL_M−4 from the end portion at the drain-side. The present embodiment is different from FIG. 17 in that there are only the dummy word line WL_M−1 and the two unselected word lines WL_M−2 and WL_M−3 at the drain-side with respect to the selected word line.

The applied voltages of the other word lines WL_M−5, WL_M−6, ..., WL_0 and the selection gate line SGS are the same as those of the thirteenth embodiment.

A voltage Vread_D4 (≥Vread_D1) is applied to the dummy word line WL_M−1. A voltage Vread91 (Vread<Vread91<Vread2) and a voltage Vread92 (>Vread) are respectively applied to the unselected word lines WL_M−3 and WL_M−2 at the drain-side. The read pass voltage Vread92 is higher than the read pass voltage Vread. Therefore, a voltage as high as the voltage Vread_D1 is sufficient as the voltage Vread_D4 in essence. On the other hand, from the perspective of the electric filed strength, the potential difference between the word lines WL_M−1 and WL_M−2 is desirably small, and the voltage Vread_D4 is desirably set at a value higher than the voltage Vread_D1. Therefore, according to the applied structure of the NAND cell, when the cell characteristics and its electric filed strength can be ensured, the voltage Vread_D4 is desirably set at the same level as the voltage Vread_D1, and when the reliability and the electric filed strength cannot be ensured, the voltage Vread_D4 is desirably set at a value higher than the voltage Vread_D1.

The voltage VSG10 applied to the drain-side selection gate line SGD needs to be equal to or more than the voltage VSG, but according to the voltage Vread_D4 and the applied structure of the NAND cell, when the reliability and the electric filed strength voltage can be ensured, e.g., when the voltage Vread_D4 is higher than Vread_D1, the voltage VSG10 is desirably more than the voltage VSG, and when the reliability and the electric filed strength voltage cannot be ensured, the voltage VSG10 is desirably the same as the voltage VSG.

Seventeenth Embodiment

Subsequently, a nonvolatile semiconductor memory device according to a seventeenth embodiment will be explained with reference to FIG. 21.

Like the thirteenth embodiment, this embodiment shows a voltage application method using a dummy word line wherein a selected word line is a word line at the end portion at the cell source-side.

In the present embodiment, the word lines WL_0 and WL_M−1 adjacent to the selection gate lines SGS, SGD at both of the source-side and the drain-side are adopted as dummy word lines. However, the same effects can be obtained even when only a word line adjacent to at least one of the selection gate lines at the source-side and the drain-side is adopted as a dummy word line.

Figure 21:
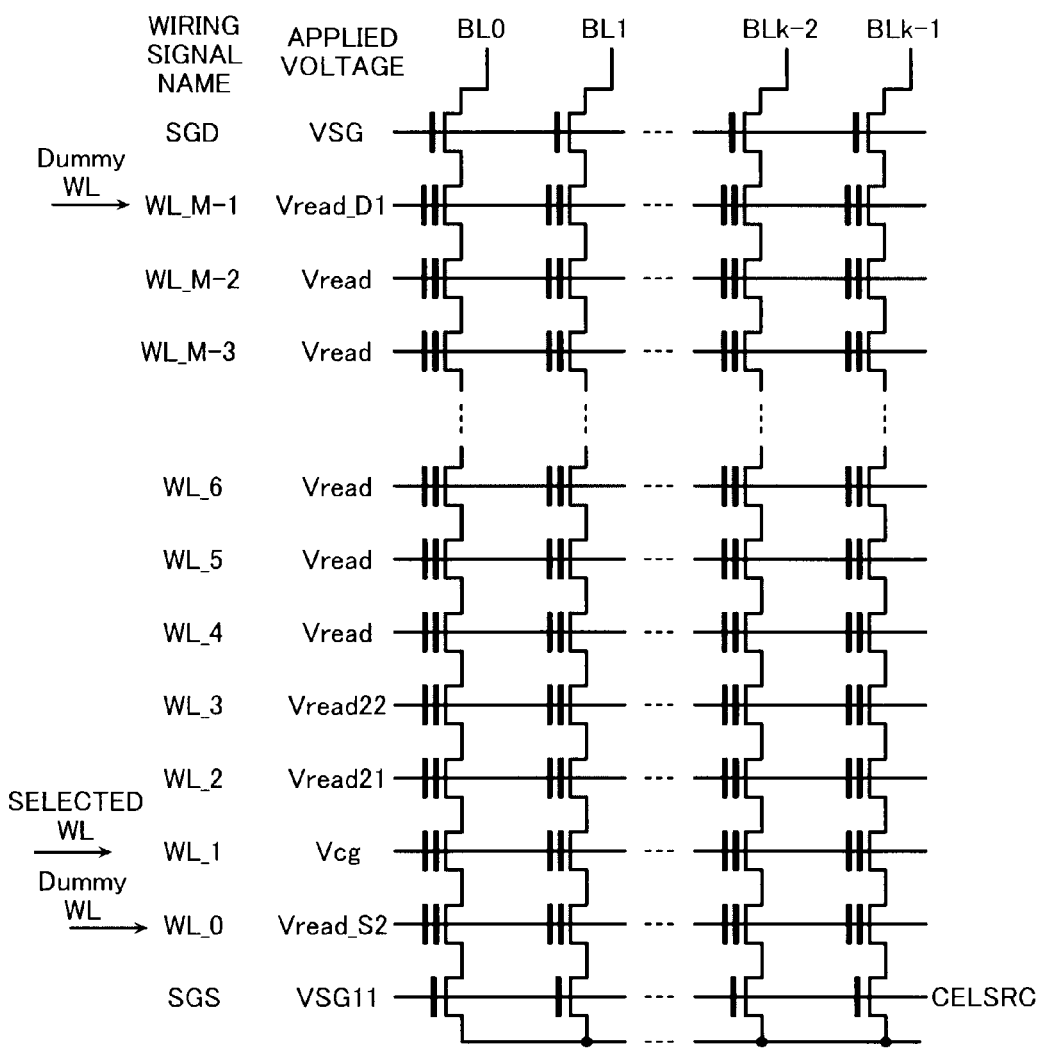
FIG. 21 is a figure illustrating an applied voltage during read process of a memory cell array according to a seventeenth embodiment.

As shown in FIG. 21, the selected word line is the second word line WL_1 from the cell source-side. The present embodiment is different from FIG. 17 in that there is only the dummy word line WL_0 at the cell source-side with respect to the selected word line.

The applied voltages of the other word lines WL_1, WL_2, ..., WL_M−1 and the selection gate line SGD are the same as those of the thirteenth embodiment.

A voltage Vread_S2 (≥Vread_S1) is applied to the dummy word line WL_0. In this case, since there is only one word line (dummy word line WL_0) at the cell source-side with respect to the selected word line, it is desirable to follow the voltage application method in the conventional example as shown in FIG. 32.

However, the dummy cell may be in erase state. When the dummy cell is in erase state, the threshold value (Vth) is low, and it is not necessary to increase the voltage to a level as high as Vread4 of FIG. 15. The voltage of Vread_S2 may be determined within a range equal to or more than Vread_S1 according to the applied structure of the NAND cell.

The voltage VSG11 applied to the cell source-side selection gate SGS needs to be equal to or more than the voltage VSG. According to the applied structure of the NAND cell and the voltage Vread_S2, when the reliability and the electric filed strength of source-side selection gate SGS voltage can be ensured, the voltage VSG11 is desirably more than the voltage VSG, and when the reliability and the electric filed strength of source-side selection gate SGS voltage cannot be ensured, the voltage VSG11 is desirably the same as the voltage VSG.

Eighteenth Embodiment

Figure 22:
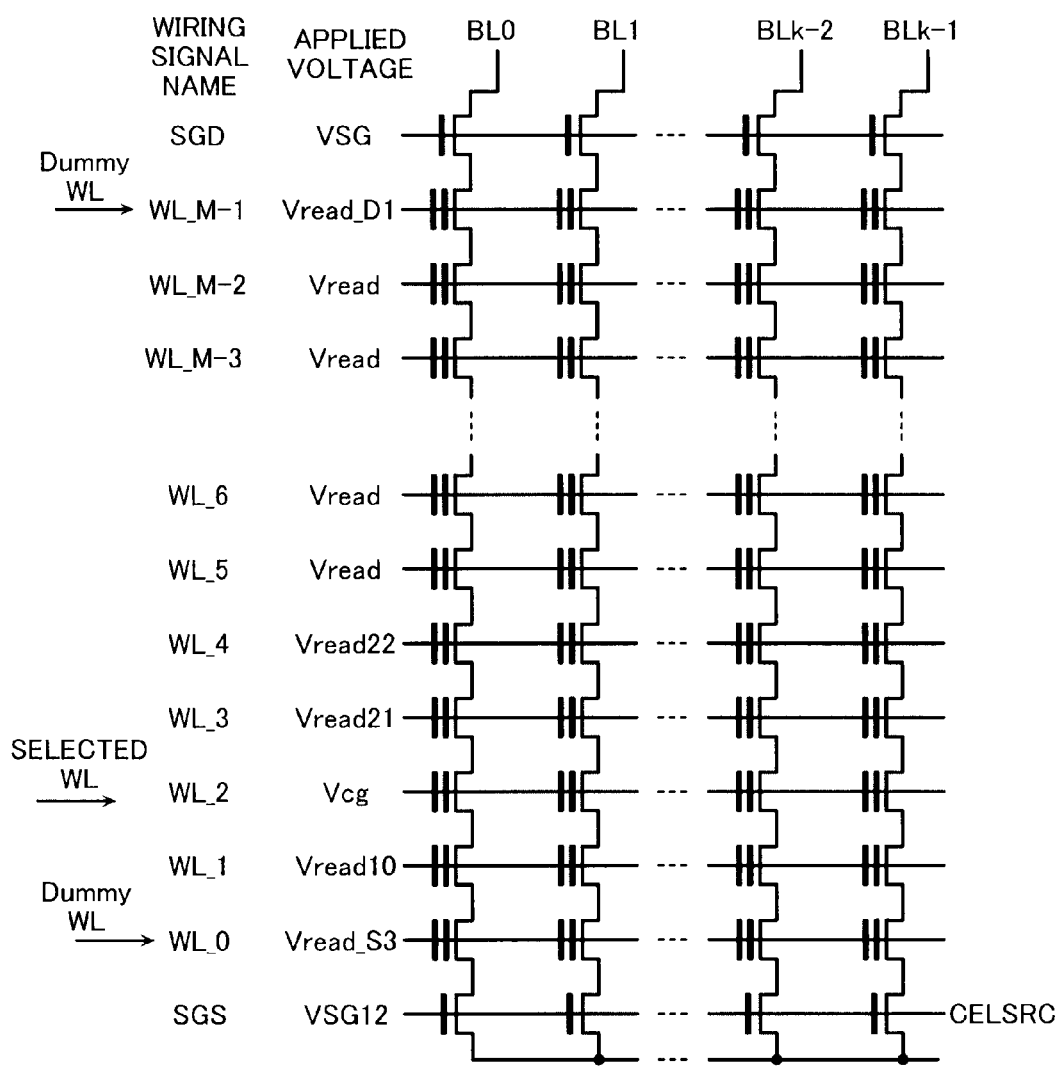
FIG. 22 is a figure illustrating an applied voltage during read process of a memory cell array according to an eighteenth embodiment.

Subsequently, a nonvolatile semiconductor memory device according to an eighteenth embodiment will be explained with reference to FIG. 22.

Like the thirteenth embodiment, this embodiment shows a voltage application method using a dummy word line wherein a selected word line is the third word line WL_2 from the end portion at the cell source-side. The present embodiment is different from FIG. 17 in that there are only the dummy word line WL_0 and one unselected word line WL_1 at the cell source-side with respect to the selected word line.

The applied voltages of the other word lines WL_3, WL_4, ..., WL_M−1 and the selection gate line SGD are the same as those of the thirteenth embodiment.

A voltage Vread_S3 (≥Vread_S1) is applied to the dummy word line WL_0. A voltage Vread10 (Vread<Vread10<Vread2) is applied to the unselected word line WL_1 at the source-side. Since the read voltage Vcg is low, the read pass voltage Vread10 needs to be set somewhat higher, but in order to reduce the potential difference between the cells, the voltage Vread_S3 is desirably set at a value higher than Vread_S1 so that the read pass voltage Vread10 is set at a voltage as low as possible.

On the other hand, the voltage VSG12 applied to the cell source-side selection gate line SGS needs to be equal to or more than the voltage VSG, but according to the voltage Vread_S3 and the applied structure of the NAND cell, when the reliability and the electric filed strength of source-side selection gate SGS can be ensured, the voltage VSG12 is desirably more than the voltage VSG, and when the reliability and the electric filed strength of source-side selection gate SGS cannot be ensured, the voltage VSG12 is desirably the same as the voltage VSG.

Nineteenth Embodiment

Figure 23:
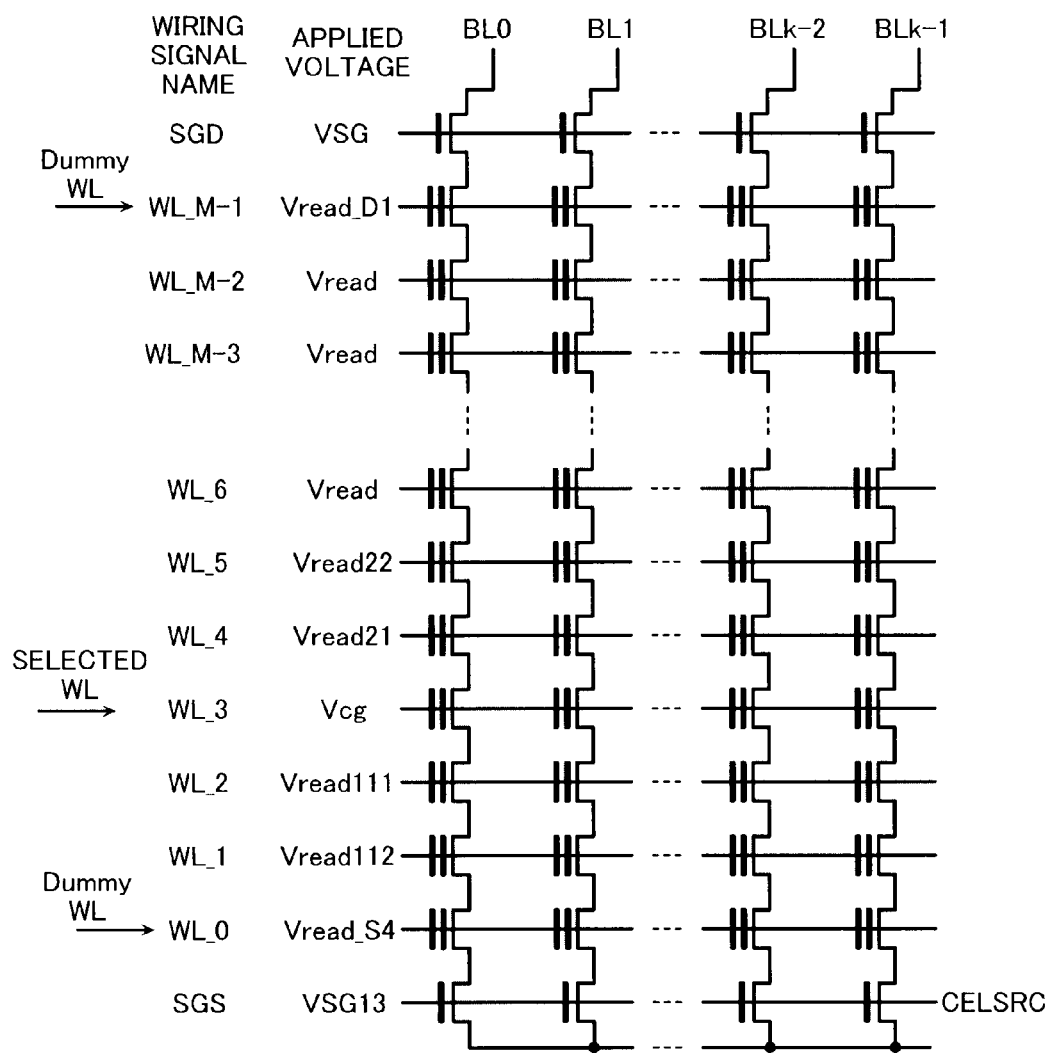
FIG. 23 is a figure illustrating an applied voltage during read process of a memory cell array according to a nineteenth embodiment.

Subsequently, a nonvolatile semiconductor memory device according to a nineteenth embodiment will be explained with reference to FIG. 23.

Like the thirteenth embodiment, this embodiment shows a voltage application method using a dummy word line wherein a selected word line is the fourth word line WL_3 from the end portion at the cell source-side. The present embodiment is different from FIG. 17 in that there are only the dummy word line WL_0 and two unselected word lines WL_1 and WL_2 at the cell source-side with respect to the selected word line.

The applied voltages of the other word lines WL_4, WL_5, . . . , WL_M−1 and the selection gate line SGD are the same as those of the thirteenth embodiment.

A voltage Vread_S4 (≥Vread_S1) is applied to the dummy word line WL_0. A voltage Vread111 (Vread<Vread111<Vread2) and a voltage Vread112 (>Vread) are respectively applied to the unselected word lines WL_2 and WL_1 at the cell source-side. The read pass voltage Vread112 is higher than the read pass voltage Vread. Therefore, a voltage as high as the voltage Vread_S1 is sufficient as the voltage Vread_S4 in essence. On the other hand, from the perspective of the electric filed strength, the potential difference between the word lines WL_0 and WL_1 is desirably small, and the voltage Vread_S4 is desirably set at a value higher than the voltage Vread_S1. Therefore, according to the applied structure of the NAND cell, when the cell characteristics and its electric filed strength can be ensured, the voltage Vread_S4 is desirably set at the same level as the voltage Vread_S1, and when the reliability and the electric filed strength voltage cannot be ensured, the voltage Vread_S4 is desirably set at a value higher than the voltage Vread_S1.

On the other hand, the voltage VSG13 applied to the cell source-side selection gate line SGS needs to be equal to or more than the voltage VSG, but according to the voltage Vread_S4 and the applied structure of the NAND cell, when the reliability and the electric filed strength of the source-side selection gate SGS can be ensured, e.g., when the voltage Vread_S4 is higher than Vread_S1, the voltage VSG13 is desirably more than the voltage VSG, and when the reliability and the electric filed strength of the source-side selection gate SGS cannot be ensured, the voltage VSG13 is desirably the same as the voltage VSG.

Twentieth Embodiment

The read operation has been hereinabove explained. Hereinafter, write verification read operation will be explained.

In this case, the present embodiment is explained as a modification of the third embodiment. However, the present embodiment can also be applied as a modification of the first and second embodiments.

FIG. 24 is a figure illustrating writing order of a NAND-type nonvolatile semiconductor memory device of two bits/cell according to a twentieth embodiment. More specifically, first, a lower page of the memory cells connected to the word line WL_0 at the end portion of the cell source is written. Subsequently, a lower page of the memory cells connected to the adjacent word line WL_1 is written. Subsequently, an upper page of the memory cells connected to the word line WL_0 previously written is written. Subsequently, a lower page of the memory cells connected to the third word line WL_2 from the cell source-side is written. This order of writing can reduce the influence caused by change of the threshold value of the adjacent cell during write process to the upper page. According to this order of writing, the memory cell array can attain the following four stages.

1) Stage immediately after lower page is written (the same state as the state during write verification read process of lower page)

2) Stage from when lower page is written to when upper page is written (two stages)

3) Stage immediately after upper page is written (the same state as the state during write verification read process of upper page)

4) Stage from when upper page is written to when data are written to all the cells in the NAND cell FIG. 25 illustrates what kind of data are stored in the memory cells connected to the word lines WL_N−5 to WL_N+5 in the above stages 1) to 4). It should be noted that encircled thick letters in the figure represent data written at the last. It should be noted that the erase state and the threshold value distribution of each of the levels A, B, C are as shown in FIG. 4.

In FIG. 25, for example, in state 1) and state 2)-1, the memory cells connected to the unselected word lines WL_N+1 to WL_N+5 at the drain-side with respect to the selected word line WL_N are in erase state. It is understood that the memory cells in erase state may have a low voltage as unselected word line voltages.

In "L", the threshold value distribution of the cell may be in two kinds of states (erase state and LM level of FIG. 4) when data of the lower page (first bit) are written to the cell, and therefore, "L" represents a state in which a somewhat high read pass voltage more than the LM level is required in order to make the cells connected to the unselected word lines in conductive state during verification read process. However, the read pass voltage does not necessarily be a voltage as high as the read pass voltage Vread during read process.

"L/U" represents a state in which the threshold value distribution of the cell may be in four kinds of states (erase states, A, B, C levels of FIG. 4) when data of the lower page (first bit) and the upper page (second bit) are written to the cell, and "L/U" represents a state in which the threshold value of the cell may be high. Therefore, the read pass voltage Vread is required in order to make the cells connected to the unselected word lines in conductive state.

As is evident from FIG. 25, in the state of 1) and 3) in which write verification read operation is performed, the threshold value of the cells connected to the word line WL_N+1 and the word lines arranged at the drain-side with respect to the word line WL_N+1 is relatively low, i.e., the state of 1) and 3) is erase state or L state. Therefore, in the state of 1) and 3), the voltage applied to the word line can be reduced.

In addition to the above points, the voltage as shown in FIG. 26 is applied in the present embodiment.

In other words, when write verification read operation of lower page is performed in state 1), the cells connected to the word line WL_N+3 and the word lines at the drain-side with respect to the word line WL_N+3 are in erase state. Accordingly, a read pass voltage Vpvd equal to or less than the voltage Vread is applied to these word lines WL_N+3, WL_N+4, . . . . This can reduce difference of the cell current (ON resistance) of the cell between write verification read process and data read process. The state 3) is also the same.

In the present embodiment, in the stage of lower page write verification read process of the state 1), Vread132, Vread131, Vread121, Vread122 are applied to the unselected word lines WL_N−2, WL_N−1, WL_N+1 and WL_N+2. In the stage of upper page write verification read process of the state 3), Vread152, Vread151, Vread141, Vread142 are respectively applied to the unselected word lines WL_N−2, WL_N−1, WL_N+1 and WL_N+2. Regardless of the stages 1) to 4), in read operation, the same voltage as that of the third embodiment is applied. In this case, the following expressions hold.

$Vread122 \le Vread142 \le Vread22,$ $Vread121 \le Vread141 \le Vread21,$ $Vread131 \le Vread151 \le Vread31,$ and $Vread132 \le Vread152 \le Vread32.$ In other words, the voltages applied to the unselected word lines WL_N−2, WL_N−1, WL_N+1 and WL_N+2 are applied so that the voltages increase in order from the stage of the lower page write verification read process of the state 1), the stage of the upper page write verification read process of the state 3), and then the stage of the read operation. This can cancel the difference of the ON resistances of the cells caused by change of the data states of the cells connected to the unselected word lines WL_N−2, WL_N−1, WL_N+1 and WL_N+2, and the width of the threshold voltage (Vth) distribution can be reduced effectively, so that the write speed can be improved, or the reliability characteristics of the cells can be improved.

When the present embodiment is applied, the threshold value distribution is as follows. When data are written to a certain word line, and the cells in the word line are read after the data are stored to the cells by performing write verification process, the threshold value distribution shifts to the left as compared with the write verification read process if the cells of the word line is in the states 1) to 3) described above.

However, as shown in FIG. 4, in each write level, the verification level is higher than read level (LMR<LMV, AR<AV, BR<BV, CR<CV). Therefore, Vread132, Vread131, Vread121, Vread122 in the state 1) and Vread152, Vread151, Vread141, Vread142 in the state 3) may be set lower than Vread21, Vread22, Vread31, Vread32 as long as the threshold value distribution does not shift to the left with respect to the read level.

On the other hand, the threshold value distribution is as follows when data are written to the cells of a certain word line by performing write process and write verification process, thereafter the word line is read after write process performed on an adjacent word line. In this case, the threshold value distribution of the cells shifts to the right due to the interference caused by the adjacent cells if the cells of the word line are in the states 2) to 4). In general, the upper portion of the threshold value distribution shifts to the right more greatly than the lower portion thereof.

With regard to this point, according to the present embodiment, the threshold value distribution can be shifted to the left, and therefore, the cell-to-cell interference can be cancelled.

Twenty-First Embodiment

The twentieth embodiment shows a case where write verification read operation is performed on a certain write level.

The present embodiment shows a voltage application method where each memory cell in the NAND cell stores n bit/cell (n≥2). In this case, for example, two bits/cell are stored.

In this case, the present embodiment is shown as a modification of the third embodiment. However, this can also be modifications of the other embodiments.

When Numerical expression 3, Numerical expression 5, i.e., floating gate potential variations of the cells in the word lines WL_N+4 and WL_N+1 as shown in the conventional example and the first embodiment, are looked up, it is understood that the higher the read voltage Vcg of the selected word line WL_N is, the smaller these values are. More specifically, when the read voltage Vcg of the selected word line WL_N is high, variation of the floating gate potential of the cells connected to the adjacent unselected word line WL_N+1 decreases. Therefore, in the threshold value distribution of the cell as shown in FIG. 4, when a level of a high threshold value such as C level and B level is read, the read voltage Vcg increases. Therefore, the floating gate potential variation of the cells connected to the unselected word line WL_N+1 is small, and is less likely to be affected by the cells of the adjacent word line.

Accordingly, in the present embodiment, the higher the threshold value level of read data is, the lower values the read pass voltages Vread21, Vread31 are set at. Further, in synchronization with this, Vread22, Vread32 are set at low values.

By carrying out the present embodiment, the number of times Vread21, Vread22, Vread31, Vread32, i.e., voltages higher than the read pass voltage Vread, are applied can be reduced, and deterioration of the reliability of the cells can be avoided. In particular, deterioration of read-disturb (phenomenon that causes change in data stored in the memory cells when read operation is repeated) can be avoided.

Like what is described in the above embodiments, data are written to the cells in the adjacent word line WL_N+1 after the cells in the word line WL_N are written. Therefore, the degree of the cell-to-cell interference received by the cells of the word line WL_N can be cancelled, and the width of the threshold value distribution of the cells can be reduced effectively. As a result, the write speed can be improved, or the reliability characteristics of the cells can be improved.

Figure 27:
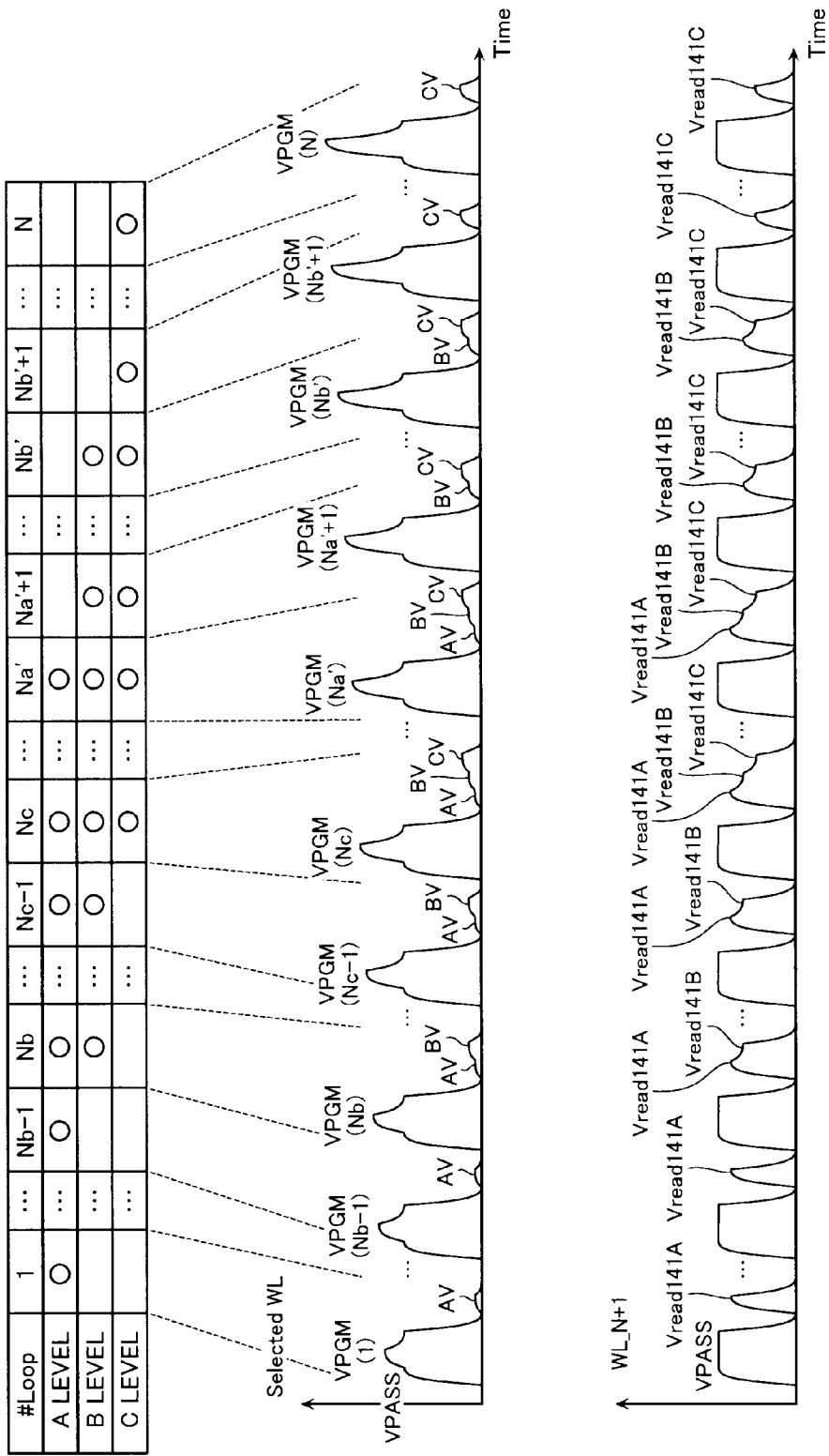
FIG. 27 is a figure illustrating applied voltage waveforms of a selected word line and an adjacent unselected word line during write and verification read process of the memory cell array according to a twenty-first embodiment.

FIG. 27 is a figure illustrating an example of write operation and write verification operation waveforms of the selected word line (WL_N) when the memory cell stores two bits/cell according to the present embodiment. In this figure, the waveform in the stage of the state 3) of the previous embodiment is shown. In other words, this shows the waveforms of write/write verification read operation when the upper page is written. On the other hand, FIG. 27 shows operation waveforms of the adjacent unselected word line WL_N+1 corresponding to the applied voltages to the selected word line WL_N. It should be noted that the unselected word lines WL_N+2, WL_N−1 and WL_N−2 also have the same tendency such as magnitude relationship.

As shown in the figure, the voltage of the unselected word line WL_N+1 changes according to the write level so that the read pass voltages satisfy the following expression: Vread141≥Vread141A≥Vread141B≥Vread141C.

In the present embodiment, for example, the read pass voltage VPASS is a constant and equal voltage in each write loop with respect to the word lines WL_N+1 and WL_N. Alternatively, it is to be understood that the voltage of VPASS may be changed between the word line WL_N and the word line WL_N+1, or the voltage may be gradually increased in each write loop, whereby the same effects as those of the present embodiment can be obtained.

On the other hand, when the present embodiment is carried out, timing of the voltage application including write voltages is not particularly limited.

Like the read pass voltage Vread141, the same effects can also be obtained even when different voltages are supplied with regard to Vread142, Vread151, Vread152 according to the write levels of A, B, C levels.

Further, the same effects can be obtained when a Vread121LM (≤Vread121), Vread122LM (≤Vread122), and a Vread131LM (≤Vread131), Vread132LM (≤Vread132) are respectively applied to the word lines WL_N+1, WL_N+2, WL_N−1 and WL_N−2 in the stage of the state 1) of the previous embodiment.

Twenty-Second Embodiment

Figure 29:
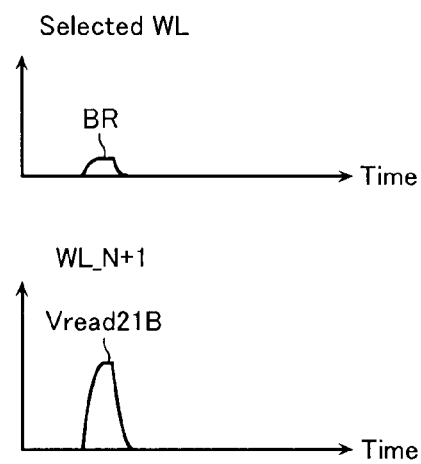
FIG. 29 is a figure illustrating applied voltage waveforms of a selected word line and an adjacent unselected word line during read process of the memory cell array according to the embodiment.
Figure 30:
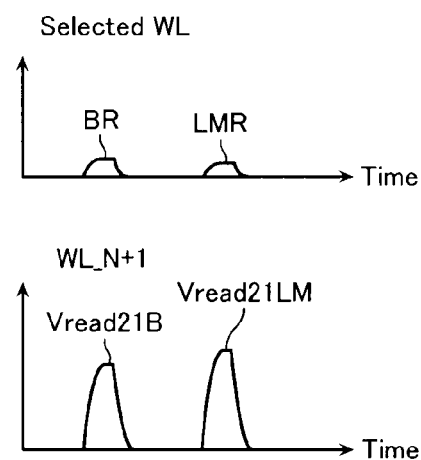
FIG. 30 is a figure illustrating applied voltage waveforms of a selected word line and an adjacent unselected word line during read process of the memory cell array according to the embodiment.

The above is the embodiment about the write verification read operation. Likewise, in the read operation, operations as shown in FIGS. 28, 29, 30 can be shown as examples.

Figure 28:
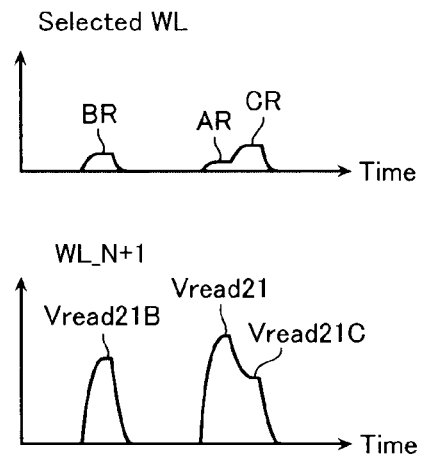
FIG. 28 is a figure illustrating applied voltage waveforms of a selected word line and an adjacent unselected word line during read process of the memory cell array according to a twenty-second embodiment.

FIG. 28 illustrates upper page read operation waveforms in the stages from the states 3) to 4) according to the twentieth embodiment, which respectively show applied voltages of the selected word line WL_N and the adjacent unselected word line WL_N+1. It should be noted that the unselected word lines WL_N+2, WL_N−1 and WL_N−2 also have the same tendency such as magnitude relationship.

As shown in the figure, in the read operation at the A level, the read pass voltage Vread21 described in the third embodiment is applied to the unselected word line WL_N+1, and Vread21B (≤Vread21) and Vread21C (≤Vread21) are respectively applied in the read operations at the B level and the C level.

As described in the twentieth embodiment, the following expressions are desirably satisfied: Vread141B≤Vread_21B, Vread141C≤Vread21C.

From the perspective of the gate dielectric reliability characteristics of the cell such as read-disturb, the read pass voltages Vread21B, Vread21C are desirably low. However, in order to effectively reduce the width of the threshold value distribution, the read pass voltages Vread21B, Vread21C are desirably high (Vread21) as compared with the verification operation. The voltage may be determined according to the applied structure.

FIG. 29 illustrates lower page read operation waveforms in the stages from the states 3) to 4) according to the twentieth embodiment, which respectively show applied voltages of the selected word line WL_N and the adjacent unselected word line WL_N+1. It should be noted that the unselected word lines WL_N+2, WL_N−1 and WL_N−2 also have the same tendency such as magnitude relationship.

In this case, in the lower page, border of data resides between the B level and the A level. Therefore, only the operation in the first half of FIG. 28 (read process at the B level) is sufficient, and the voltage application method is the same as that of FIG. 28.

FIG. 30 illustrates lower page read operation waveforms in the stages from the states 1) to 2) according to the twentieth embodiment, which respectively show applied voltages of the selected word line WL_N and the adjacent unselected word line WL_N+1. It should be noted that the unselected word lines WL_N+2, WL_N−1 and WL_N−2 also have the same tendency such as magnitude relationship.

In this case, as shown in FIG. 4, the threshold value distribution of the cell is such that since the border of data in the lower page is at the LMR level, read process is performed on the LMR level in the latter half of the operation.

In general, LMR<BR holds. Therefore, a voltage is desirably applied to the adjacent unselected word line WL_N+1 so as to satisfy Vread21B<Vread21LM≤Vread21.

As explained in FIG. 28, Vread121≤Vread21LM is desirably satisfied.

The above embodiment is only an example, and even when a voltage different from Vread is applied to a word line to which the read pass voltage Vread is applied, the same effects can be obtained by applying the present embodiment.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array having a NAND cell unit including a plurality of memory cells connected in series each having a control gate and a charge storage layer, one end of the NAND cell unit being connected to a bit line via a first selection gate transistor, the other end of the NAND cell unit being connected to a source line via a second selection gate transistor, control gates of the plurality of memory cells being respectively connected to word lines, gates of the first and second selection gate transistors being respectively connected to the first and second selection gate lines; and
a control circuit, wherein during data read process, the control circuit gives a read voltage to a selected word line connected to a selected memory cell of the plurality of memory cells from which data is read, and gives read pass voltages for turning on the memory cells regardless of cell data to unselected word lines connected to unselected memory cells of the plurality of memory cells,
the control circuit respectively giving a first read pass voltage, a second read pass voltage, and a third read pass voltage to a first unselected word line adjacent to the selected word line at a side of at least one of a bit line and a source line, a second unselected word line adjacent to the first unselected word line at a side opposite to the selected word line, and a third unselected word line adjacent to the second unselected word line at a side opposite to the selected word line,
the second read pass voltage being higher than the third read pass voltage.

2. The nonvolatile semiconductor memory device according to claim 1, wherein the first read pass voltage is equal to or more than the third read pass voltage.

3. The nonvolatile semiconductor memory device according to claim 1, wherein the first read pass voltage is equal to or less than the second read pass voltage.

4. The nonvolatile semiconductor memory device according to claim 1, wherein the first read pass voltage is equal to the second read pass voltage.

5. The nonvolatile semiconductor memory device according to claim 1, wherein the control circuit gives a fourth read pass voltage higher than the third read pass voltage to a fourth unselected word line adjacent to the third unselected word line at a side opposite to the selected word line.

6. The nonvolatile semiconductor memory device according to claim 1, wherein at least one of both ends of the plurality of memory cells connected in series is a dummy cell in erase state, and
the control circuit applies a fifth read pass voltage lower than the third read pass voltage to a dummy word line connected to the dummy cell.

7. The nonvolatile semiconductor memory device according to claim 1, wherein the control circuit sets the third read pass voltage for write verification read process at a voltage lower than the third read pass voltage for read process.

8. The nonvolatile semiconductor memory device according to claim 1, wherein the higher the read voltage applied to the selected word line is, the lower the control circuit sets the first read pass voltage.

9. The nonvolatile semiconductor memory device according to claim 1, wherein when any one of a first word line adjacent to the first selection gate line, a second word line adjacent to the first word line at a source line side, and a third word line adjacent to the second word line at a source line side is the selected word line, the control circuit sets the voltage applied to the first selection gate line at a voltage higher than the voltage applied to the first selection gate line when a line other than the first to third word lines is the selected word line.

10. The nonvolatile semiconductor memory device according to claim 1, wherein when any one of a fourth word line adjacent to the second selection gate line, a fifth word line adjacent to the fourth word line at a bit line side, and a sixth word line adjacent to the fifth word line at a bit line side is the selected word line, the control circuit sets the voltage applied to the second selection gate line at a voltage higher than the voltage applied to the second selection gate line when a line other than the fourth to sixth word lines is the selected word line.

11. A nonvolatile semiconductor memory device comprising:
a memory cell array having a NAND cell unit including a plurality of memory cells connected in series each having a control gate and a charge storage layer, one end of the NAND cell unit being connected to a bit line via a first selection gate transistor, the other end of the NAND cell unit being connected to a source line via a second selection gate transistor, control gates of the plurality of memory cells being respectively connected to word lines, gates of the first and second selection gate transistors being respectively connected to the first and second selection gate lines; and
a control circuit, wherein during data read process, the control circuit gives a read voltage to a selected word line connected to a selected memory cell of the plurality of memory cells from which data is read, and gives read pass voltages for turning on the memory cells regardless of cell data to unselected word lines connected to unselected memory cells of the plurality of memory cells,
the control circuit respectively giving a first read pass voltage, a second read pass voltage, and a third read pass voltage to a first unselected word line adjacent to the selected word line at a side of at least one of a bit line and a source line, a second unselected word line adjacent to the first unselected word line at a side opposite to the selected word line, and a third unselected word line adjacent to the second unselected word line at a side opposite to the selected word line,
a read pass voltage lower than the second read pass voltage being given to at least memory cells of the plurality of memory cells connected in series except memory cells connected to the first unselected word line, the second unselected word line, the third unselected word line, a fourth unselected word line adjacent to the third unselected word line at a side opposite to the selected word line, a fifth unselected word line adjacent to the selected word line at a side opposite to the first unselected word line, a sixth unselected word line adjacent to the fifth unselected word line at a side opposite to the selected word line, a seventh unselected word line adjacent to the sixth unselected word line at a side opposite to the selected word line, and memory cells at both ends of the plurality of memory cells connected in series.

12. The nonvolatile semiconductor memory device according to claim 11, wherein the first read pass voltage is equal to or more than the third read pass voltage.

13. The nonvolatile semiconductor memory device according to claim 11, wherein the first read pass voltage is equal to or less than the second read pass voltage.

14. The nonvolatile semiconductor memory device according to claim 11, wherein the third read pass voltage for write verification read process is set at a voltage lower than the third read pass voltage for read process.

15. The nonvolatile semiconductor memory device according to claim 11, wherein the higher the read voltage applied to the selected word line is, the lower the first read pass voltage is.

16. A method for controlling a nonvolatile semiconductor memory device, comprising:
a memory cell array having a NAND cell unit including a plurality of memory cells connected in series each having a control gate and a charge storage layer, one end of the NAND cell unit being connected to a bit line via a first selection gate transistor, the other end of the NAND cell unit being connected to a source line via a second selection gate transistor, control gates of the plurality of memory cells being respectively connected to word lines, gates of the first and second selection gate transistors being respectively connected to the first and second selection gate lines; and
a control circuit, wherein during data read process, the control circuit gives a read voltage to a selected word line connected to a selected memory cell of the plurality of memory cells from which data is read, and gives read pass voltages for turning on the memory cells regardless of cell data to unselected word lines connected to unselected memory cells of the plurality of memory cells,
a first read pass voltage being applied to a first unselected word line adjacent to the selected word line at a side of at least one of a bit line and a source line,
a second read pass voltage being applied to a second unselected word line adjacent to the first unselected word line at a side opposite to the selected word line,
a third read pass voltage lower than the second read pass voltage being applied to a third unselected word line adjacent to the second unselected word line at a side opposite to the selected word line.

17. The method for controlling a nonvolatile semiconductor memory device according to claim 16, wherein the first read pass voltage is equal to or more than the third read pass voltage.

18. The method for controlling a nonvolatile semiconductor memory device according to claim 16, wherein the first read pass voltage is equal to or less than the second read pass voltage.

19. The method for controlling a nonvolatile semiconductor memory device according to claim 16, wherein the third read pass voltage for write verification read process is set at a voltage lower than the third read pass voltage for read process.

20. The method for controlling a nonvolatile semiconductor memory device according to claim 16, wherein the higher the read voltage applied to the selected word line is, the lower the first read pass voltage is.

* * * * *